(12) United States Patent
Fujita et al.

(10) Patent No.: US 8,233,310 B2
(45) Date of Patent: Jul. 31, 2012

(54) RESISTANCE-CHANGE MEMORY

(75) Inventors: Katsuyuki Fujita, Yokohama (JP);
Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/847,892

(22) Filed: Jul. 30, 2010

(65) Prior Publication Data

US 2011/0249485 A1 Oct. 13, 2011

(30) Foreign Application Priority Data

Apr. 12, 2010 (JP) ................................. 2010-091551

(51) Int. Cl.
*G11C 11/00* (2006.01)
*G11C 11/14* (2006.01)
*G11C 11/15* (2006.01)

(52) U.S. Cl. ........ 365/148; 365/158; 365/163; 365/171; 365/173

(58) Field of Classification Search .................. 365/148, 365/158, 163, 171, 173
See application file for complete search history.

(56) References Cited

U.S. PATENT DOCUMENTS

| | | | | |
|---|---|---|---|---|
| 6,205,073 B1 * | 3/2001 | Naji | ............................. | 365/148 |
| 6,584,011 B2 * | 6/2003 | Watanabe | ..................... | 365/158 |
| 6,791,876 B2 * | 9/2004 | Tanizaki et al. | ............... | 365/158 |
| 6,829,158 B2 * | 12/2004 | Naji | ............................. | 365/158 |
| 6,888,743 B2 * | 5/2005 | Durlam et al. | ................ | 365/158 |
| 7,206,222 B2 * | 4/2007 | Hidaka | ......................... | 365/158 |
| 7,286,394 B2 * | 10/2007 | Ooishi | ......................... | 365/158 |
| 7,324,366 B2 * | 1/2008 | Bednorz et al. | ............... | 365/148 |
| 7,376,006 B2 * | 5/2008 | Bednorz et al. | ............... | 365/158 |
| 7,394,685 B2 * | 7/2008 | Ooishi et al. | .................. | 365/171 |
| 7,505,307 B2 | 3/2009 | Ueda | | |
| 7,548,450 B2 * | 6/2009 | Aoki | ............................. | 365/158 |
| 8,111,540 B2 * | 2/2012 | Asao et al. | .................... | 365/148 |

FOREIGN PATENT DOCUMENTS

JP 2008-047220 2/2008
WO WO 03/065377 A1 8/2003

OTHER PUBLICATIONS

U.S. Appl. No. 12/818,028, filed Jun. 17, 2010, Fujita et al.

* cited by examiner

*Primary Examiner* — Trong Phan
(74) *Attorney, Agent, or Firm* — Knobbe, Martens, Olson & Bear, LLP

(57) ABSTRACT

According to one embodiment, a resistance-change memory includes bit lines running in a first direction, word lines running in a second direction, and a memory cell array includes memory cells each includes a selection transistor and a variable resistance element. In a layout of first to fourth variable resistance elements arranged in order in the first direction, the first variable resistance element and the second variable resistance element sandwich one word line therebetween, the third variable resistance element and the fourth variable resistance element sandwich one word line therebetween, a first pair includes the first and second variable resistance elements and a second pair includes the third and fourth variable resistance elements sandwich two word lines therebetween, and a column is constructed by repeating the layout in the first direction.

18 Claims, 26 Drawing Sheets

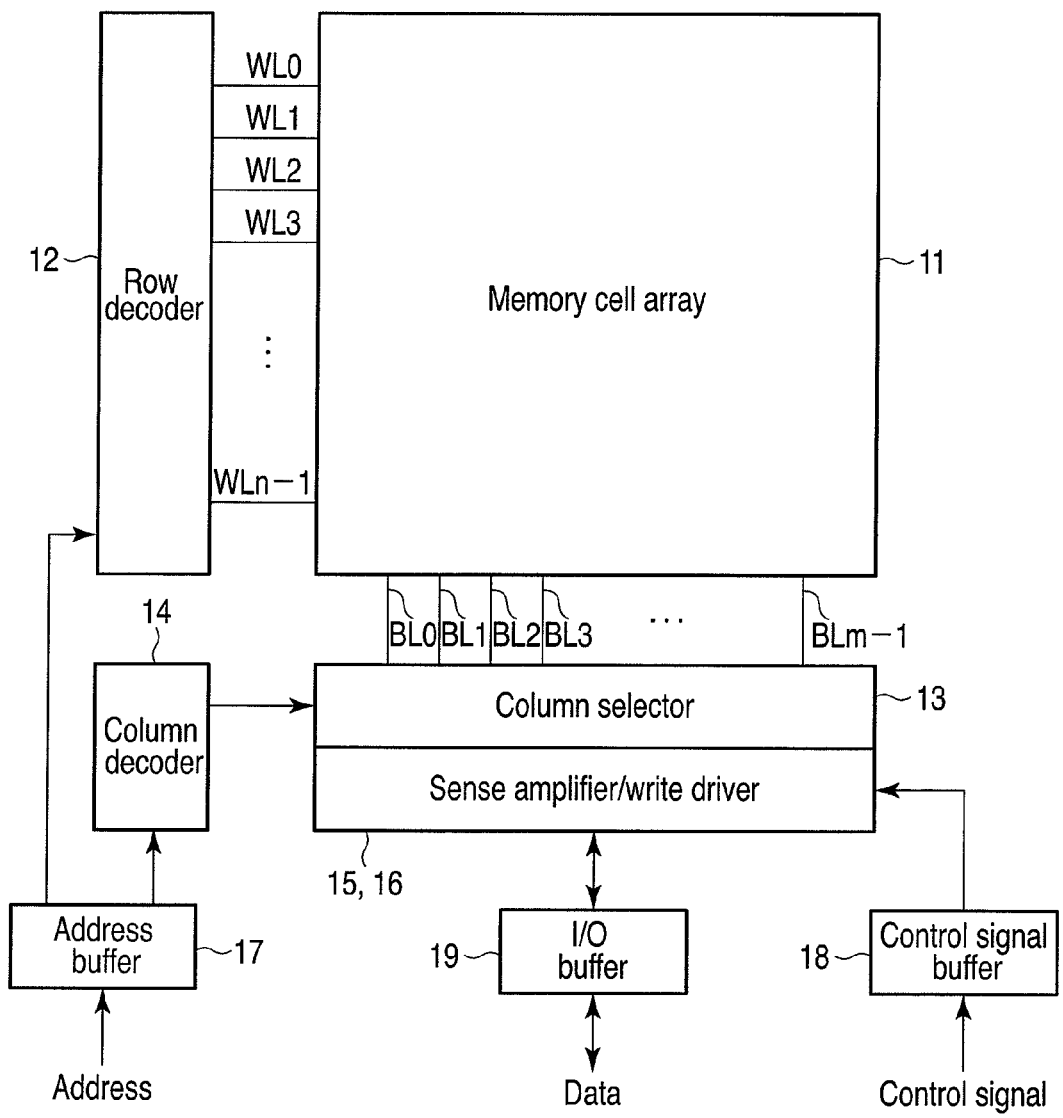
F I G. 1

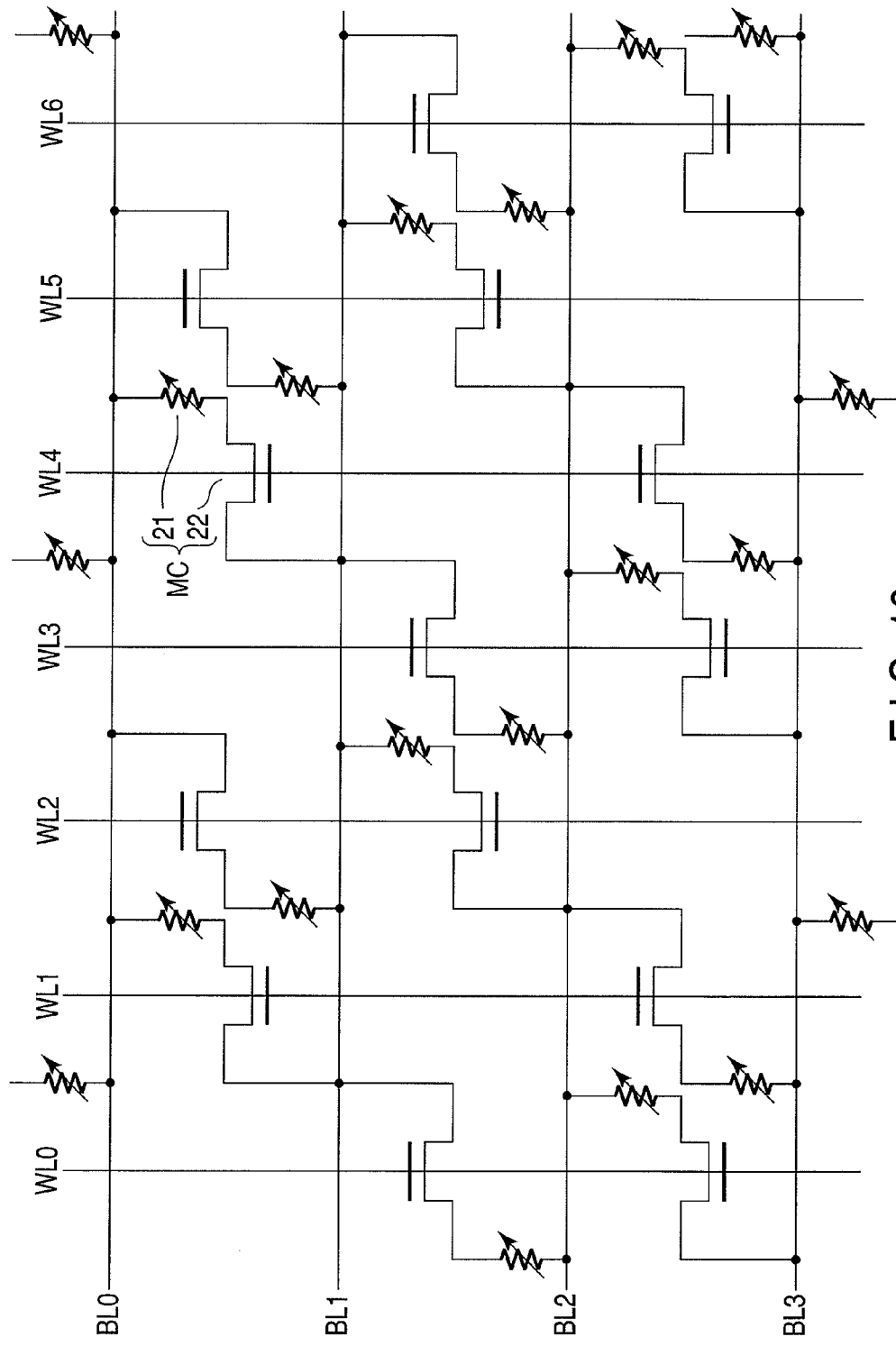
F I G. 18

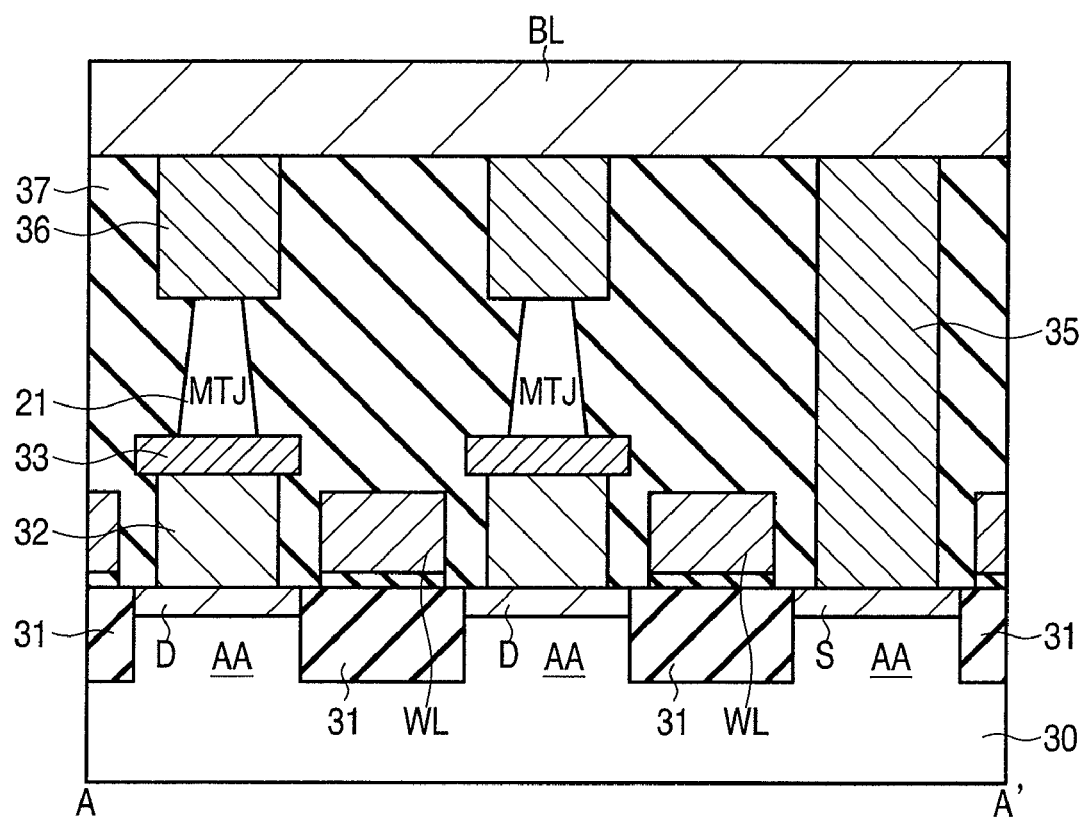
F I G. 20

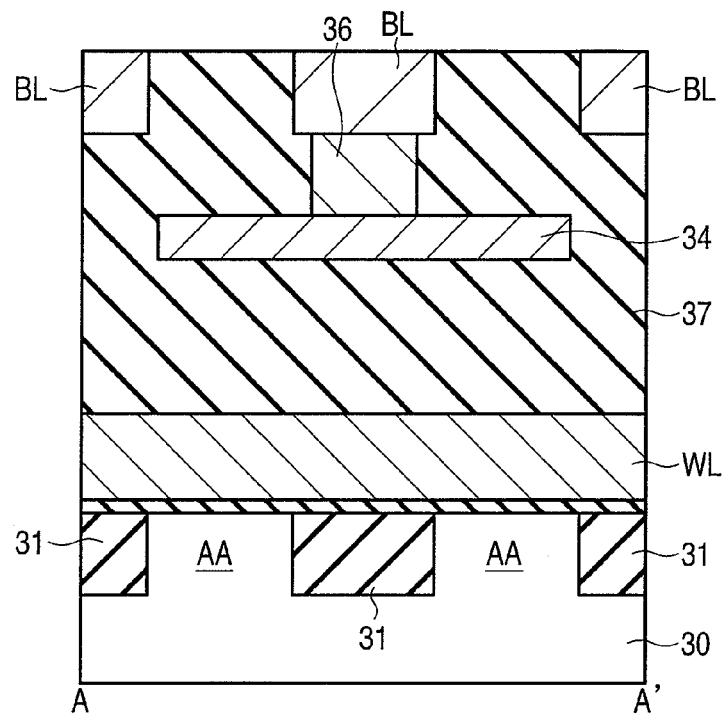
F I G. 27
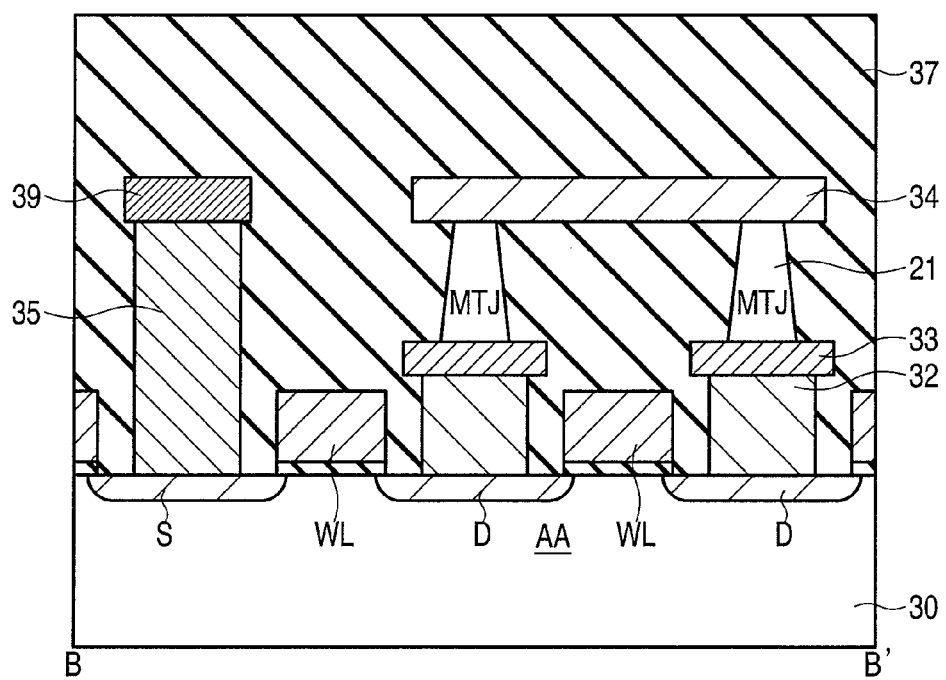
F I G. 28

RESISTANCE-CHANGE MEMORY

CROSS-REFERENCE TO RELATED APPLICATIONS

This application is based upon and claims the benefit of priority from Japanese Patent Application No. 2010-091551, filed Apr. 12, 2010; the entire contents of which are incorporated herein by reference.

FIELD

Embodiments described herein relate generally to a resistance-change memory.

BACKGROUND

Examples of a resistance-change memory that stores data by using the resistance change of a memory element are a magnetic random access memory (MRAM), resistive random access memory (ReRAM), and a phase-change random access memory (PCRAM).

As one of these resistance-change memories, an MRAM using the spin transfer writing method has been disclosed (reference: Jpn. Pat. Appln. KOKAI Publication No. 2008-47220). In this reference as shown in, e.g., FIG. 21, the memory cell area is reduced by decreasing the bit line pitch by using two layers of bit lines. To implement the above mentioned memory cell, however, it is necessary to implement a very difficult step of forming a contact extending from the upper bit line to a transistor by self-alignment over the lower bit line. This raises the possibility that the contact extending from the upper bit line to the transistor and the lower bit line shortcircuit.

In implementing a contact formation step that decreases the possibility like that, it is difficult to apply a low-resistance wiring material such as copper (Cu) to the bit lines, so a high-resistance wiring material such as tungsten (W) is applied. This reduces the read margin of a resistance-change memory such as an MRAM.

BRIEF DESCRIPTION OF THE DRAWINGS

FIG. 1 is a block diagram showing the arrangement of an MRAM 10 according to the first embodiment;
FIG. 18 is a circuit diagram of a memory cell array 11 according to the third embodiment;
FIG. 20 is a sectional view of the memory cell array 11 taken along line A-A' in FIG. 19;
FIG. 27 is a sectional view of the memory cell array 11 taken along line A-A' in FIG. 26;
FIG. 28 is a sectional view of the memory cell array 11 taken along line B-B' in FIG. 26.

DETAILED DESCRIPTION

Figure 2:
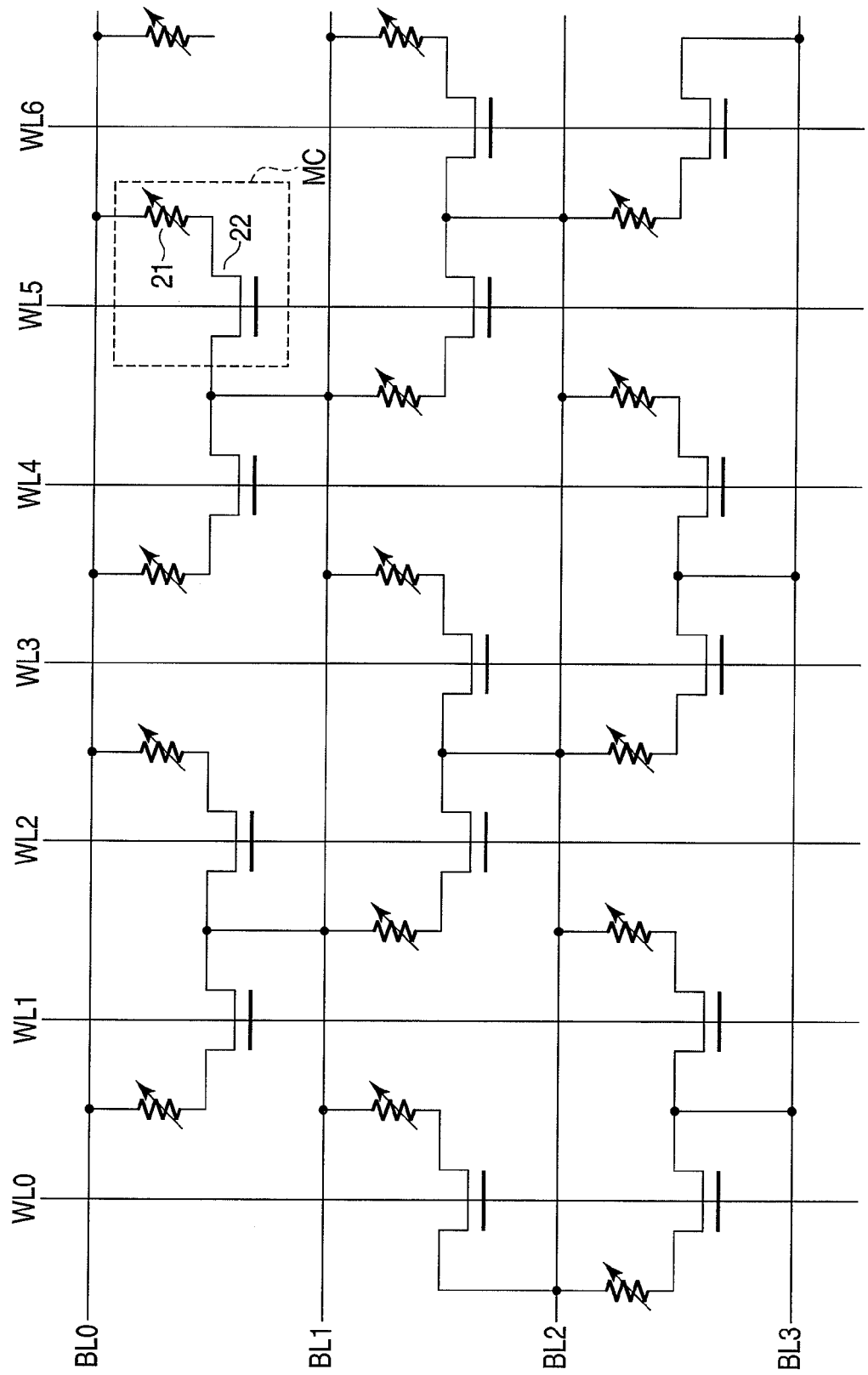
FIG. 2 is a circuit diagram of a memory cell array 11.

In general, according to one embodiment, there is provided a resistance-change memory comprising:
bit lines running in a first direction;
word lines running in a second direction intersecting with the first direction; and
a memory cell array comprising memory cells each comprising a selection transistor and a variable resistance element configured to store data "0" and data "1" by a change in resistance value, the variable resistance element comprising a first terminal connected to a first bit line and a second terminal connected to a drain of the selection transistor, the selection transistor comprising a source connected to a second bit line and a gate connected to a word line,
wherein in a layout of first to fourth variable resistance elements arranged in order in the first direction, the first variable resistance element and the second variable resistance element sandwich one word line therebetween, the third variable resistance element and the fourth variable resistance element sandwich one word line therebetween, a first pair comprising the first and second variable resistance elements and a second pair comprising the third and fourth variable resistance elements sandwich two word lines therebetween, and
a column is constructed by repeating the layout in the first direction.

The embodiments will be described hereinafter with reference to the accompanying drawings. In the description which follows, the same or functionally equivalent elements are denoted by the same reference numerals, to thereby simplify the description.

First Embodiment

Various kinds of memories such as an MRAM, ReRAM, and PCRAM can be used as resistance-change memories. This embodiment will be explained by taking an MRAM as an example of a resistance-change memory. The MRAM includes a magnetic tunnel junction (MTJ) element using the magnetoresistive effect as a memory element, and stores information in accordance with the magnetization arrangement of this MTJ element.

FIG. 1 is a block diagram showing the arrangement of an MRAM 10 according to the first embodiment. In a memory cell array 11, memory cells MC each including an MTJ element (variable resistance element) 21 are arranged in a matrix. The memory cell array 11 includes n word lines WL0 to WLn−1 running in the Y-direction, and m bit lines BL0 to BLm−1 running in the X-direction which intersects with the Y-direction. Each of n and m is an integer of 1 or more.

A row decoder 12 is connected to word lines WL0 to WLn−1. The row decoder 12 selects one of the n word lines WL based on a row address.

A sense amplifier (read circuit) 15 and write driver (write circuit) 16 are connected to bit lines BL0 to BLm−1 via a column selector 13. The column selector 13 includes, e.g., N-channel metal oxide semiconductor field effect transistors (MOSFETs) equal in number to bit lines BL0 to BLm−1, and selects a bit line BL necessary for the operation in accordance with an instruction from a column decoder 14. The column decoder 14 decodes a column address, and sends the decoded signal to the column selector 13.

The sense amplifier 15 senses data stored in a selected memory cell as a read target based on a read current flowing through the selected memory cell. The data read by the sense amplifier 15 is output to an external device via an input/output buffer (I/O buffer) 19.

The write driver 16 receives write data from an external device via the I/O buffer 19, and writes the data in a selected memory cell as a write target by supplying a write current to bit lines.

An address buffer 17 receives addresses from an external device, and sends a row address to the row decoder 12 and a column address to the column decoder 14. A control signal buffer 18 receives a control signal from an external device, and sends the control signal to the sense amplifier 15 and write driver 16. This control signal contains, e.g., a write command, read command, and erase command.

FIG. 2 is a circuit diagram of the memory cell array 11. The memory cell MC includes the MTJ element 21 and a selection transistor 22. The selection transistor 22 is, e.g., an N-channel MOSFET. The MTJ element 21 has one terminal connected to bit line BL0, and the other terminal connected to the drain of the selection transistor 22. The selection transistor 22 has a source connected to bit line BL1, and a gate connected to word line WL.

Figure 3:
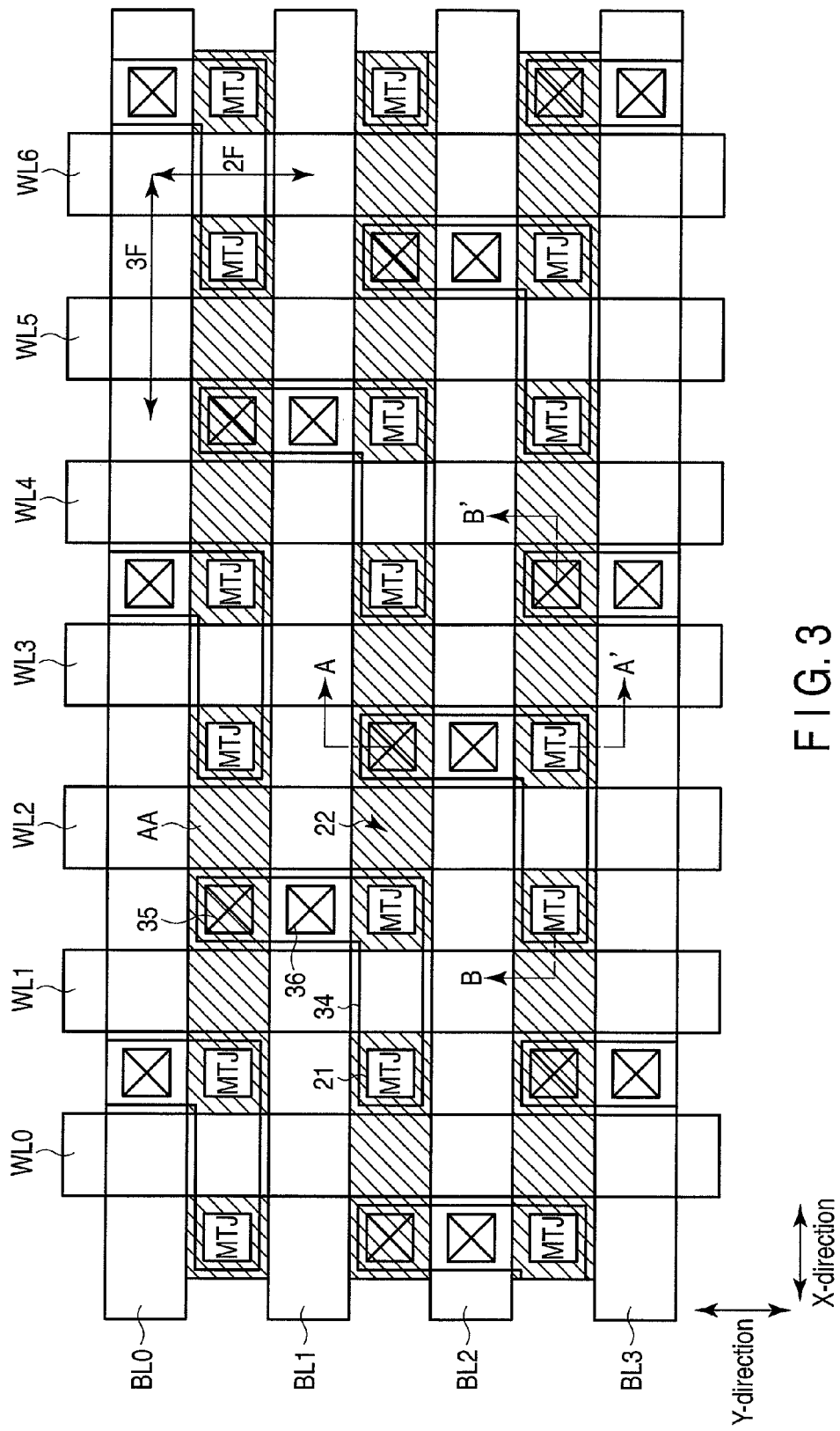
FIG. 3 is a layout view showing the arrangement of the memory cell array 11.
Figure 4:
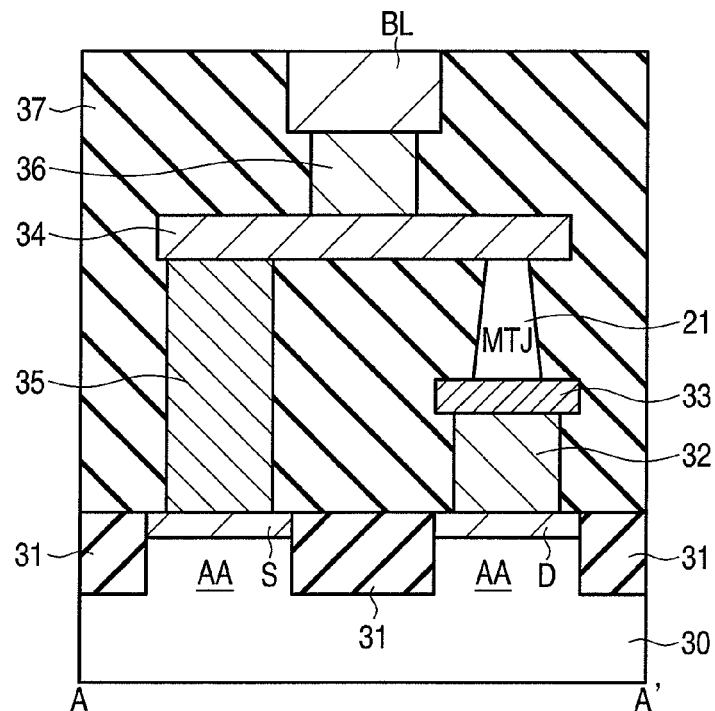
FIG. 4 is a sectional view of the memory cell array 11 taken along line A-A' in FIG. 3.
Figure 5:
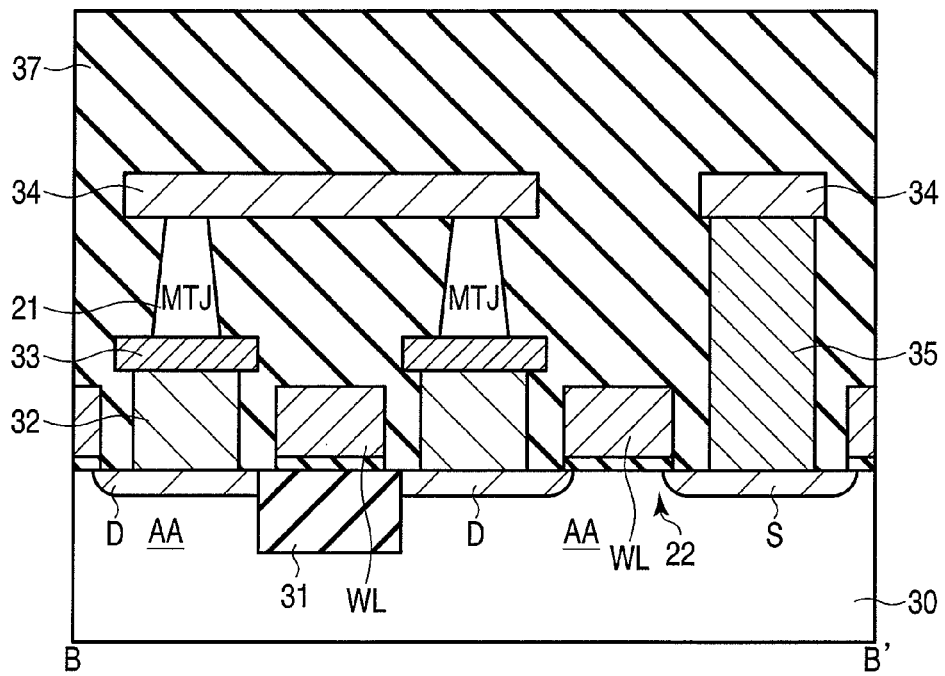
FIG. 5 is a sectional view of the memory cell array 11 taken along line B-B' in FIG. 3.

FIG. 3 is a layout view showing the arrangement of the memory cell array 11. FIG. 4 is a sectional view of the memory cell array 11 taken along line A-A' in FIG. 3. FIG. 5 is a sectional view of the memory cell array 11 taken along line B-B' in FIG. 3.

Element isolation insulating layers 31 are formed in a P-type semiconductor substrate 30. Areas in the surface region of the P-type semiconductor substrate 30 where the element isolation insulating layers 31 are not formed are element areas (active areas) AA. Referring to FIG. 3, hatched portions are the element areas AA. The element isolation insulating layers 31 are made of, e.g., a shallow trench isolation (STI).

The plurality of element areas AA extend in the X-direction and have island-like patterns. The planar shape of each element area AA is, e.g., a rectangle. In a plan view, the element areas AA are arranged between the bit lines. A second element area adjacent to a first element area in the Y-direction is formed obliquely to the first element area. In other words, the first and second element areas are formed to sandwich one bit line between them, and the second element area is shifted from the first element area by one word line in the X-direction (to the right in FIG. 3).

Each element area AA includes a source region S and drain region D formed apart from each other. Each of the source region S and drain region D is an $N^+$-type diffusion region formed by heavily doping an $N^+$-type impurity in the P-type semiconductor substrate 30. A gate electrode is formed on a gate insulating film on the element area AA between the source region S and drain region D. This gate electrode corresponds to word line WL running in the Y-direction. The selection transistor 22 is thus formed.

A via plug 32 is formed on the drain region D. The MTJ element 21 is formed on a lower electrode 33 on the via plug 32. The layout view of FIG. 3 does not show the via plug 32 and lower electrode 33 in order to avoid complicating the drawing. In practice, however, the via plug 32 and lower electrode 33 are formed below the MTJ element 21 as shown in FIG. 4. An upper electrode 34 is formed on the MTJ element 21. The upper electrode 34 connects the upper portions of two MTJ elements 21 adjacent to each other in the X-direction so as to sandwich one word line between them.

A via plug 35 is formed on the source region S. The upper electrode 34 is formed on the via plug 35. That is, the upper electrode 34 is L-shaped: the upper electrode 34 connects two MTJ elements 21 adjacent to each other in the X-direction so as to sandwich one word line between them, and the source region S adjacent to the right-side MTJ element 21 of the two MTJ elements 21 in the Y-direction.

A via plug 36 is formed on the upper electrode 34. Bit line BL running in the X-direction is formed on the via plug 36. An interlayer dielectric layer 37 fills the portion between the P-type semiconductor substrate 30 and bit line BL.

The feature of the layout of the MTJ elements 21 will be explained below. As shown in FIG. 3, in the layout of four MTJ elements (first to fourth MTJ elements) arranged in order in the X-direction, the first and second MTJ elements are arranged to sandwich one word line between them, and the third and fourth MTJ elements are arranged to sandwich one word line between them. Also, a first pair including the first and second MTJ elements and a second pair including the third and fourth MTJ elements are arranged to sandwich one word line between them. A column is constructed by repeating the above layout in the X-direction.

A second column adjacent to a first column in the Y-direction has a layout obtained by shifting the first column by one word line in the X-direction (to the right in FIG. 3). A third column adjacent to the second column in the Y-direction and subsequent columns are constructed in accordance with this rule.

This will be explained with reference to the circuit diagram of FIG. 2. Two memory cells including two selection transistors connected to two adjacent word lines and sharing the source and two MTJ elements connected to the drains of these two selection transistors make a pair. A first pair and a second pair adjacent to the first pair in the X-direction are arranged to sandwich one word line WL. A column is constructed by repeating this pattern in the X-direction. A second column adjacent to a first column in the Y-direction has a layout obtained by shifting the first column by one word line in the X-direction. A third column adjacent to the second column in the Y-direction and subsequent columns are constructed in accordance with this rule.

In this embodiment, all bit lines BL can be formed by a single layer as shown in the sectional views.

Furthermore, letting F be the minimum feature size, bit lines BL and word lines WL are formed by line-and-space (L/S) patterns having the minimum feature size F. The width of the element area AA is also the minimum feature size F. Accordingly, this embodiment can implement the memory cell MC having a size of $6F^2$.

Figures 6A, 6B:
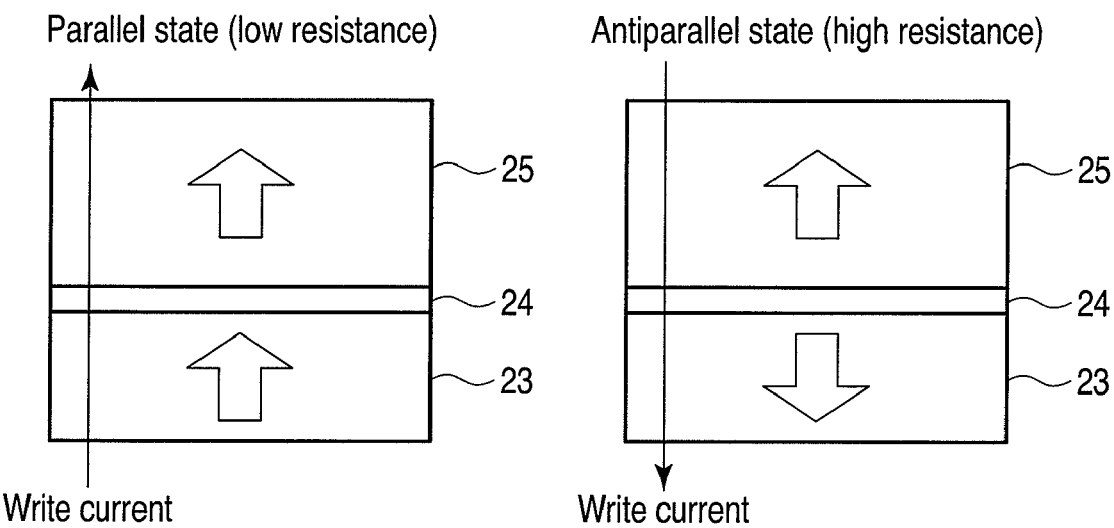
FIGS. 6A and 6B are schematic views showing the arrangement of an MTJ element 21.

An example of the arrangement of the MTJ element 21 will be explained below. FIGS. 6A and 6B are schematic views showing the arrangement of the MTJ element 21. The MTJ element 21 is formed by sequentially stacking a recording layer (also called a storage layer or free layer) 23, a nonmagnetic layer 24, and a reference layer (also called a fixed layer) 25. Note that the stacking order may be reversed.

Each of the recording layer 23 and reference layer 25 is made of a ferromagnetic material. The recording layer 23 and reference layer 25 each have magnetic anisotropy perpendicular to the film surface, and the axis of easy magnetization perpendicular to the film surface. That is, the MTJ element 21 is a so-called perpendicular magnetization MTJ element in which the magnetization directions of the recording layer 23 and reference layer 25 are perpendicular to the film surfaces. Note that the MTJ element 21 may also be an in-plane magnetization MTJ element in which the magnetization directions are parallel to the film surfaces.

In the recording layer 23, the magnetization (or spin) direction is changeable (reverses). In the reference layer 25, the magnetization direction is unchangeable (fixed). The reference layer 25 is set to have a perpendicular magnetic anisotropic energy much higher than that of the recording layer 23. The magnetic anisotropy can be set by adjusting the material configuration or film thickness. Thus, a magnetization reversing current of the recording layer 23 is decreased and made smaller than that of the reference layer 25. This makes it possible to implement the MTJ element 21 including the recording layer 23 having a changeable magnetization direction and the reference layer 25 having an unchangeable magnetization direction.

As the nonmagnetic layer 24, it is possible to use, e.g., a nonmagnetic metal, nonmagnetic semiconductor, or insulator. The nonmagnetic layer 24 is called a tunnel barrier layer when using an insulator, and called a spacer layer when using a metal.

This embodiment uses the spin transfer writing method that controls the magnetization configuration of the MTJ element 21 by directly supplying a write current to the MTJ element 21. The MTJ element 21 can take one of two states, i.e., a high-resistance state and low-resistance state, in accordance with whether the relative magnetization relationship between the recording layer 23 and reference layer 25 is parallel or antiparallel.

As shown in FIG. 6A, when a write current is supplied from the recording layer 23 to the reference layer 25 in the MTJ element 21, the relative magnetization relationship between the recording layer 23 and reference layer 25 becomes parallel. In this parallel state, the resistance value of the MTJ element 21 is lowest, i.e., the MTJ element 21 is set in the low-resistance state. The low-resistance state of the MTJ element 21 is defined as, e.g., data "0".

On the other hand, as shown in FIG. 6B, when a write current is supplied from the reference layer 25 to the recording layer 23 in the MTJ element 21, the relative magnetization relationship between the recording layer 23 and reference layer 25 becomes antiparallel. In this antiparallel state, the resistance value of the MTJ element 21 is highest, i.e., the MTJ element 21 is set in the high-resistance state. The high-resistance state of the MTJ element 21 is defined as, e.g., data "1". This makes the MTJ element 21 usable as a memory element capable of storing 1-bit data (binary data).

(Operation)

The operation of the MRAM 10 constructed as described above will be explained below. Note that the direction of a write current when writing data "0" is defined as a direction from the selection transistor 22 to the MTJ element 21, and the direction of a write current when writing data "1" is defined as a direction from the MTJ element 21 to the selection transistor 22. Note also that in order to reduce a disturbance occurring during data read, a read current flowing from the selection transistor 22 to the MTJ element 21 is supplied to the memory cell MC during data read.

Figure 7:
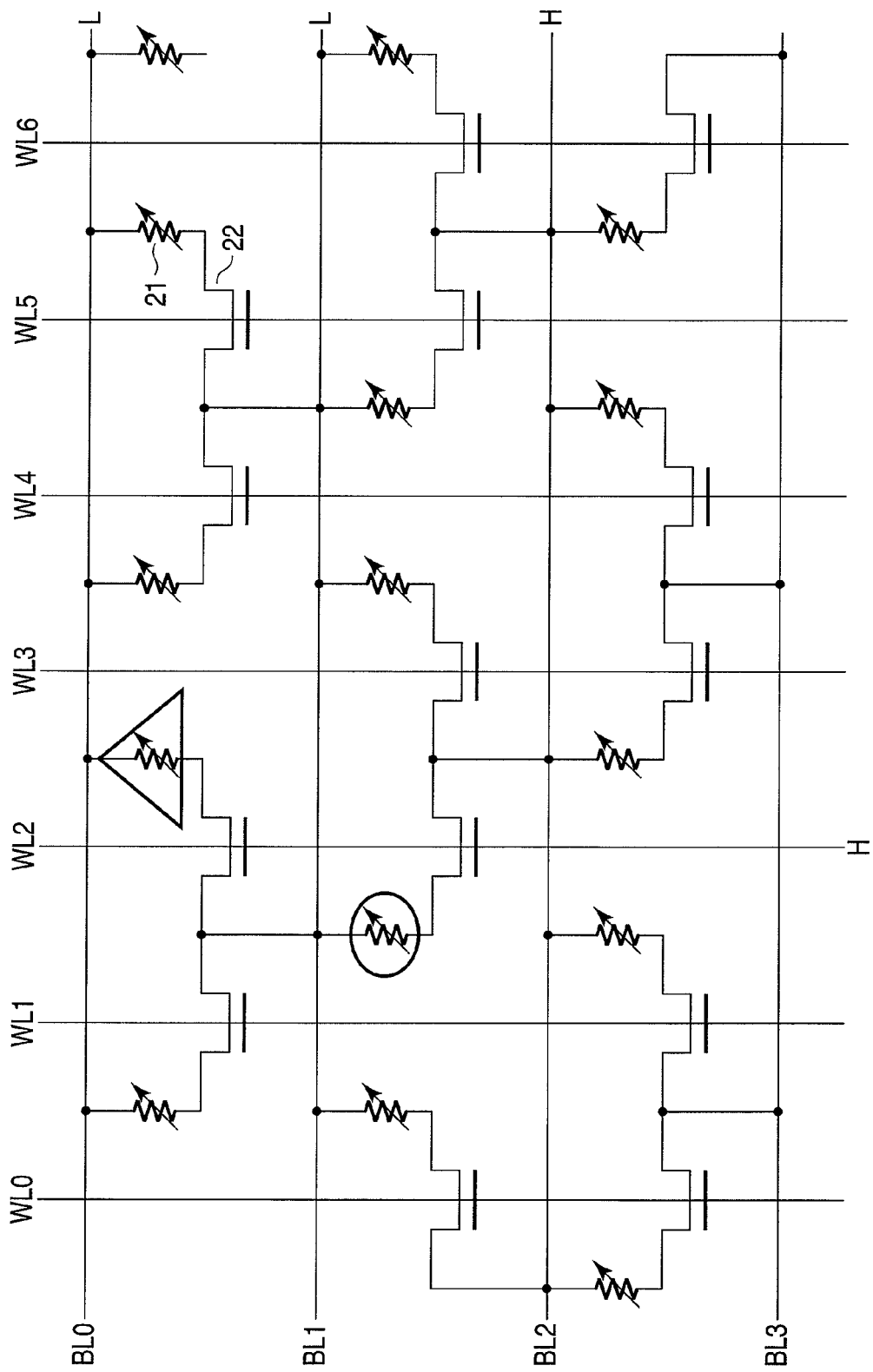
FIG. 7 is a view for explaining the operation of the MRAM 10.

First, an operation of reading data from the MTJ element 21 indicated by the circle in FIG. 7 will be described. In this case, the row decoder 12 sets word line WL2 high. Subsequently, the sense amplifier 15 sets bit line BL2 at a high voltage Vr, and bit lines BL0 and BL1 at a low voltage (ground voltage VSS). Voltage control like this supplies a read current to a selected memory cell in the direction of BL2→selection transistor→MTJ element→BL1. An operation of writing data "0" is the same as the read operation described above. However, the write driver 16 applies a high voltage Vw higher than the read voltage Vr to bit line BL.

When word line WL2 is set high, a selection transistor of an unselected memory cell indicated by the triangle is also turned on. In this embodiment, no current flows to the unselected memory cell because both bit lines BL0 and BL1 are set at the low voltage. This makes it possible to prevent a current from flowing to the unselected memory cell, thereby preventing the current of the unselected memory cell from being added to the read current of the selected memory cell. Consequently, a read error of the selected memory cell can be prevented.

Figure 8:
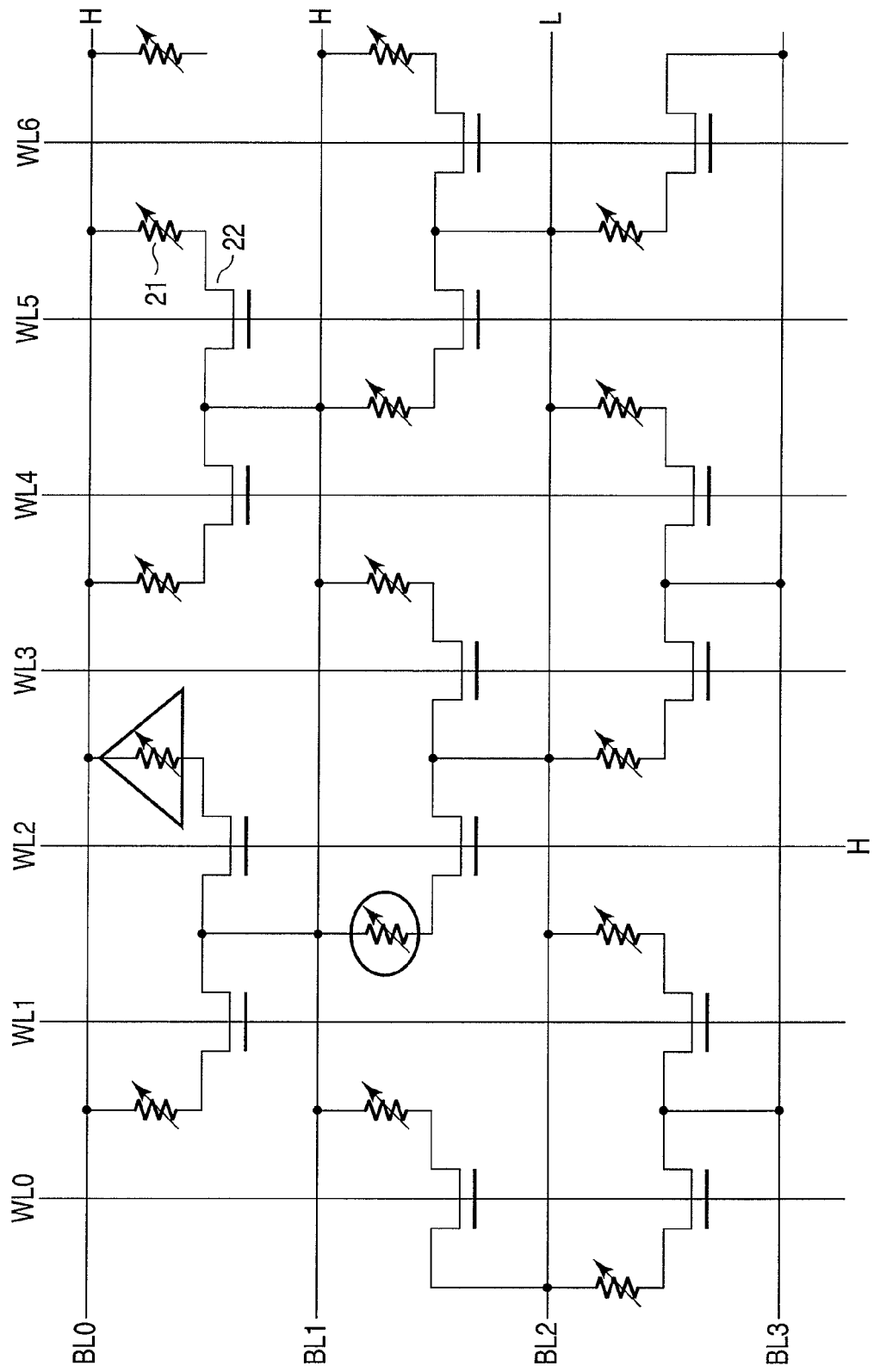
FIG. 8 is a view for explaining the operation of the MRAM 10.

As shown in FIG. 8, when writing data "1" in the MTJ element 21 indicated by the circle, the write driver 16 sets bit lines BL0 and BL1 at the high voltage Vw, and bit line BL2 at the low voltage. Voltage control like this supplies a write current to the selected memory cell in the direction of BL1→MTJ element→selection transistor→BL2. Both bit lines BL0 and BL1 are set at the high voltage in order to prevent a current from flowing to an unselected memory cell indicated by the triangle, thereby preventing a write error of the unselected memory cell.

Figure 9:
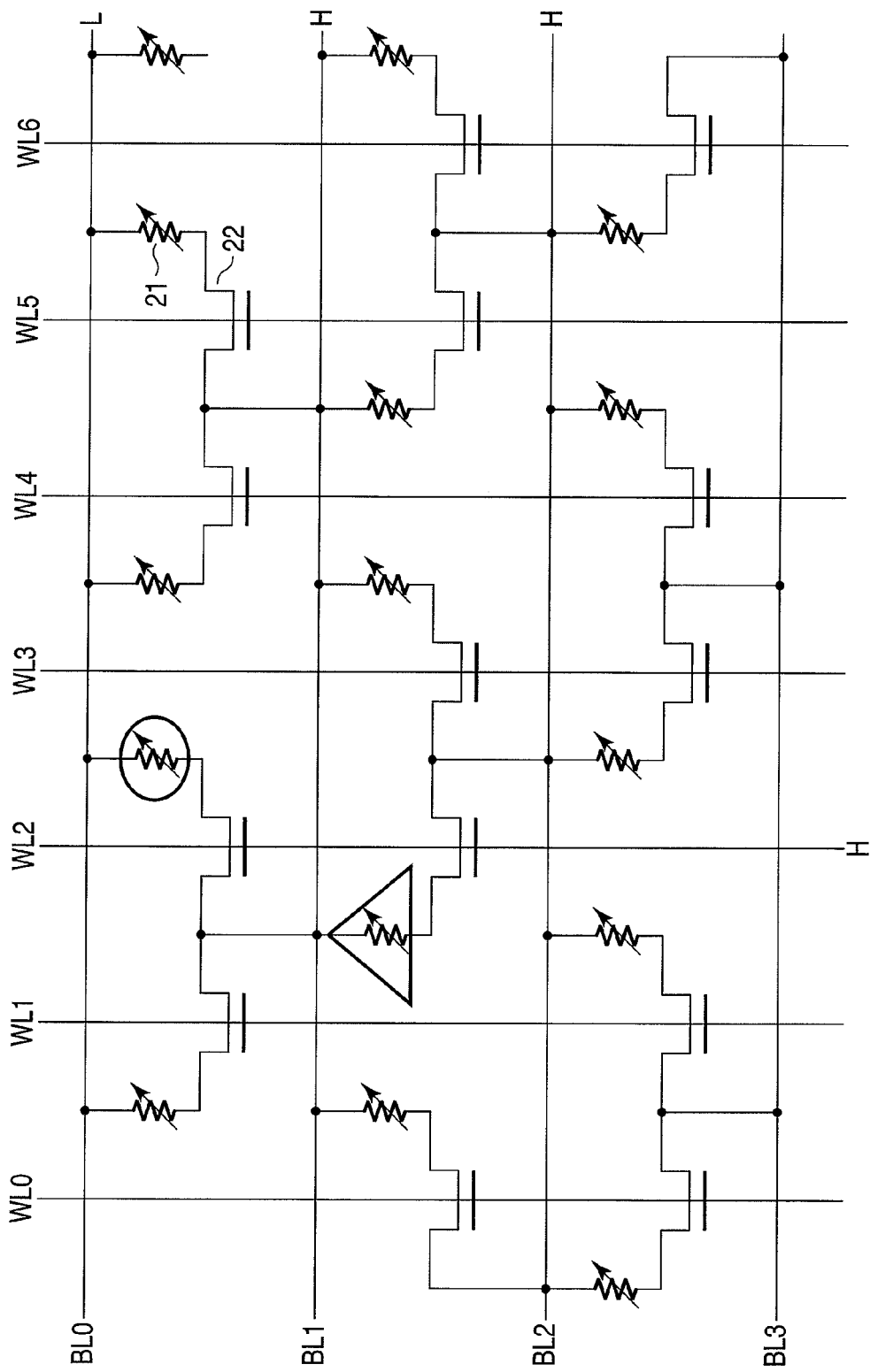
FIG. 9 is a view for explaining the operation of the MRAM 10.

Next, an operation of reading data from the MTJ element 21 indicated by the circle in FIG. 9 will be described. In this case, the row decoder 12 sets word line WL2 high. Subsequently, the sense amplifier 15 sets bit lines BL1 and BL2 at the high voltage Vr, and bit line BL0 at the low voltage. Voltage control like this supplies a read current to the selected memory cell in the direction of BL1→selection transistor→MTJ element→BL0. Both bit lines BL1 and BL2 are set at the high voltage in order to prevent a current from flowing to an unselected memory cell indicated by the triangle, thereby preventing a read error of the selected memory cell.

An operation of writing data "0" in the MTJ element 21 indicated by the circle is the same as the read operation described above. However, the write driver 16 applies the high voltage Vw higher than the read voltage Vr to bit line BL.

This makes it possible to prevent an unnecessary current from flowing to the unselected memory cell, thereby preventing a write error of the unselected memory cell.

Figure 10:
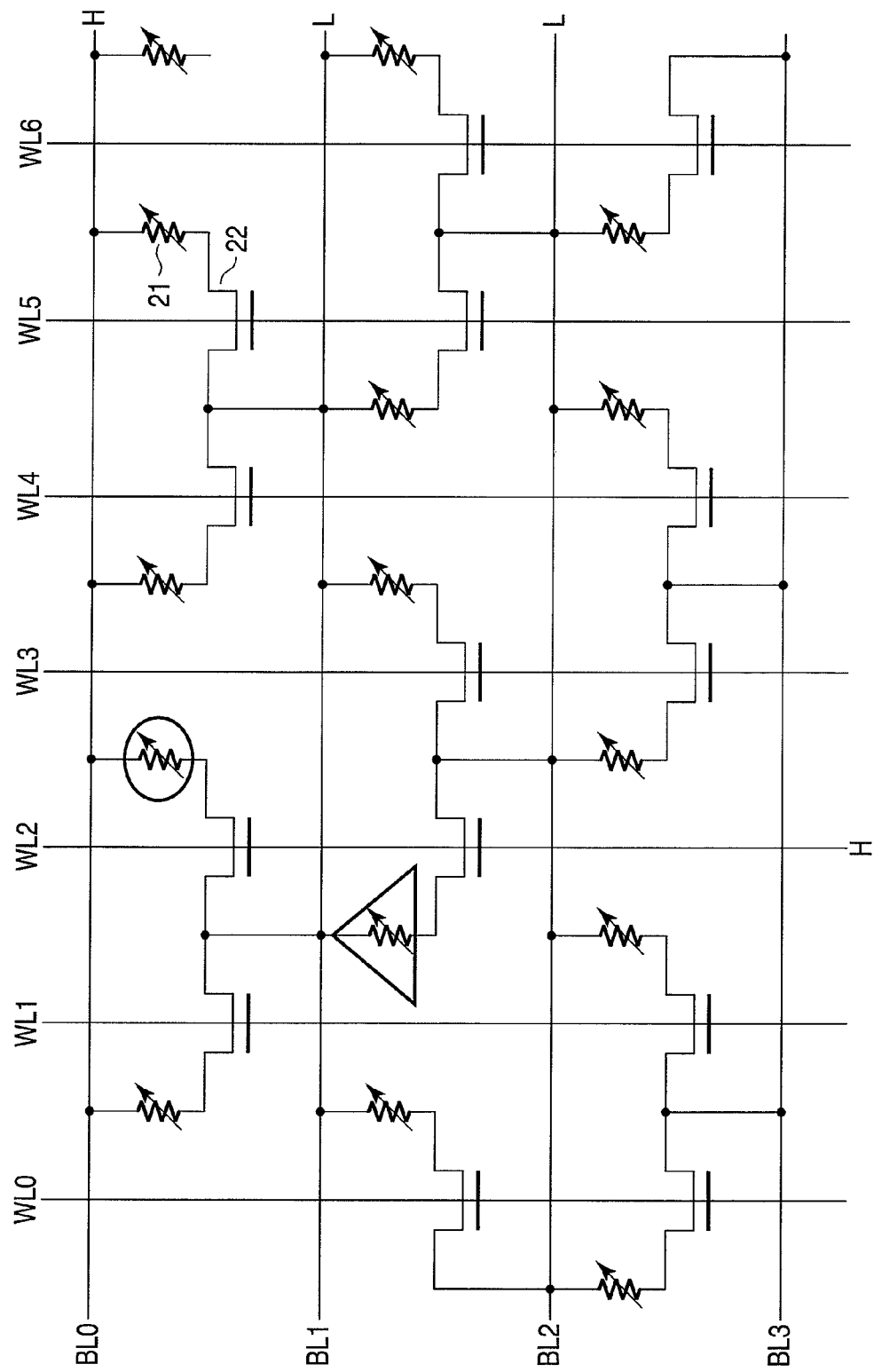
FIG. 10 is a view for explaining the operation of the MRAM 10.

As shown in FIG. 10, when writing data "1" in the MTJ element 21 indicated by the circle, the write driver 16 sets bit line BL0 at the high voltage Vw, and bit lines BL2 and BL3 at the low voltage. Voltage control like this supplies a write current to the selected memory cell in the direction of BL0→MTJ element→selection transistor→BL1. In this state, no unnecessary current that causes a write error flows to an unselected memory cell indicated by the triangle.

Figure 11:
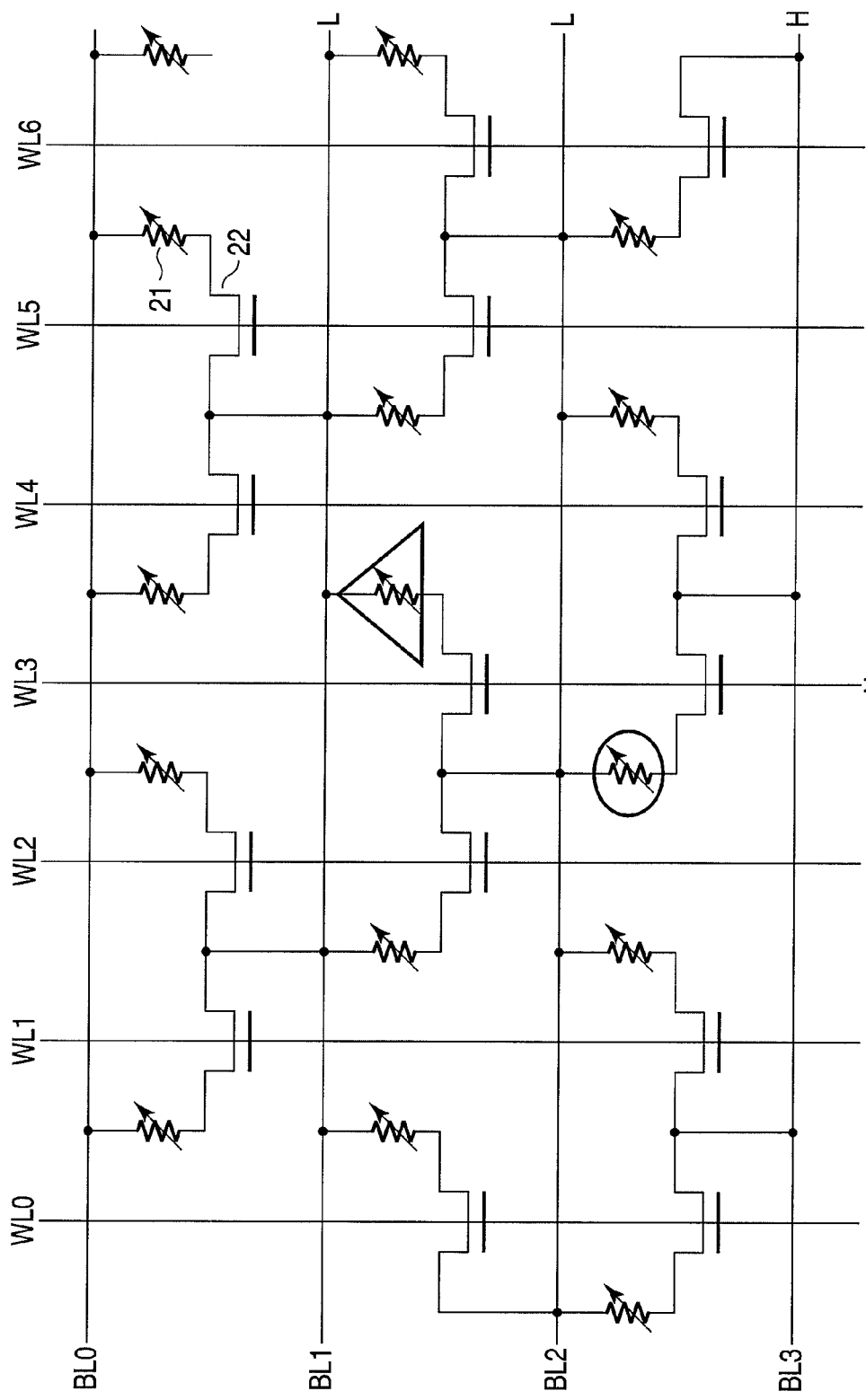
FIG. 11 is a view for explaining the operation of the MRAM 10.

An operation of reading data from the MTJ element 21 indicated by the circle in FIG. 11 will be described. In this case, the row decoder 12 sets word line WL3 high. Subsequently, the sense amplifier 15 sets bit lines BL1 and BL2 at the low voltage, and bit line BL3 at the high voltage Vr. Voltage control like this supplies a read current to the selected memory cell in the direction of BL3→selection transistor→MTJ element→BL2. This makes it possible to perform a read operation of the selected memory cell without supplying any unnecessary current to an unselected memory cell indicated by the triangle. An operation of writing data "0" in the MTJ element 21 indicated by the circle is the same as the read operation described above, except that the high voltage rises.

Figure 12:
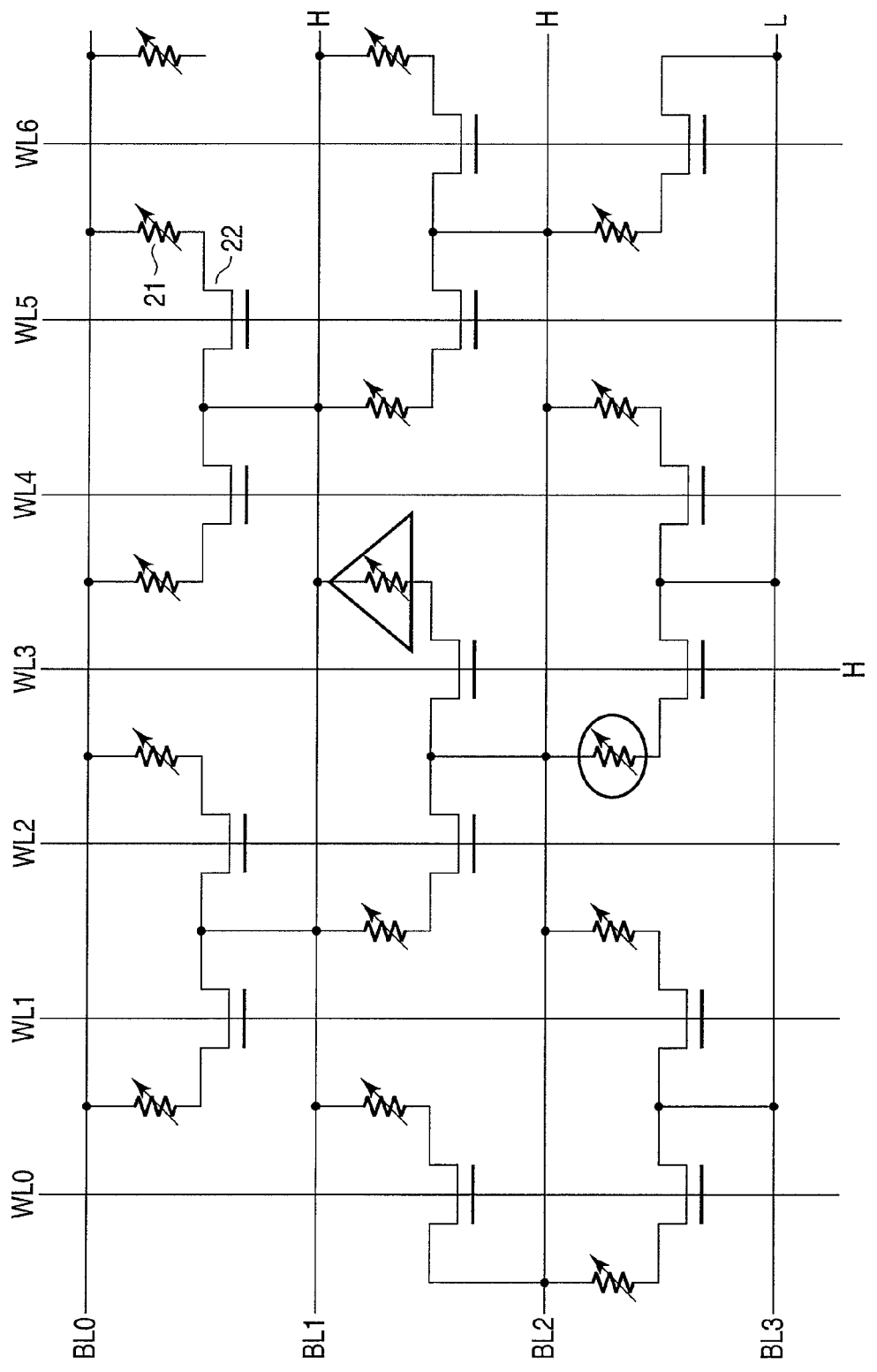
FIG. 12 is a view for explaining the operation of the MRAM 10.

As shown in FIG. 12, when writing data "1" in the MTJ element 21 indicated by the circle, the write driver 16 sets bit lines BL1 and BL2 at the high voltage Vw, and bit line BL3 at the low voltage. Voltage control like this can prevent an unnecessary current from flowing to an unselected memory cell, thereby preventing a write error of the unselected memory cell.

Figure 13:
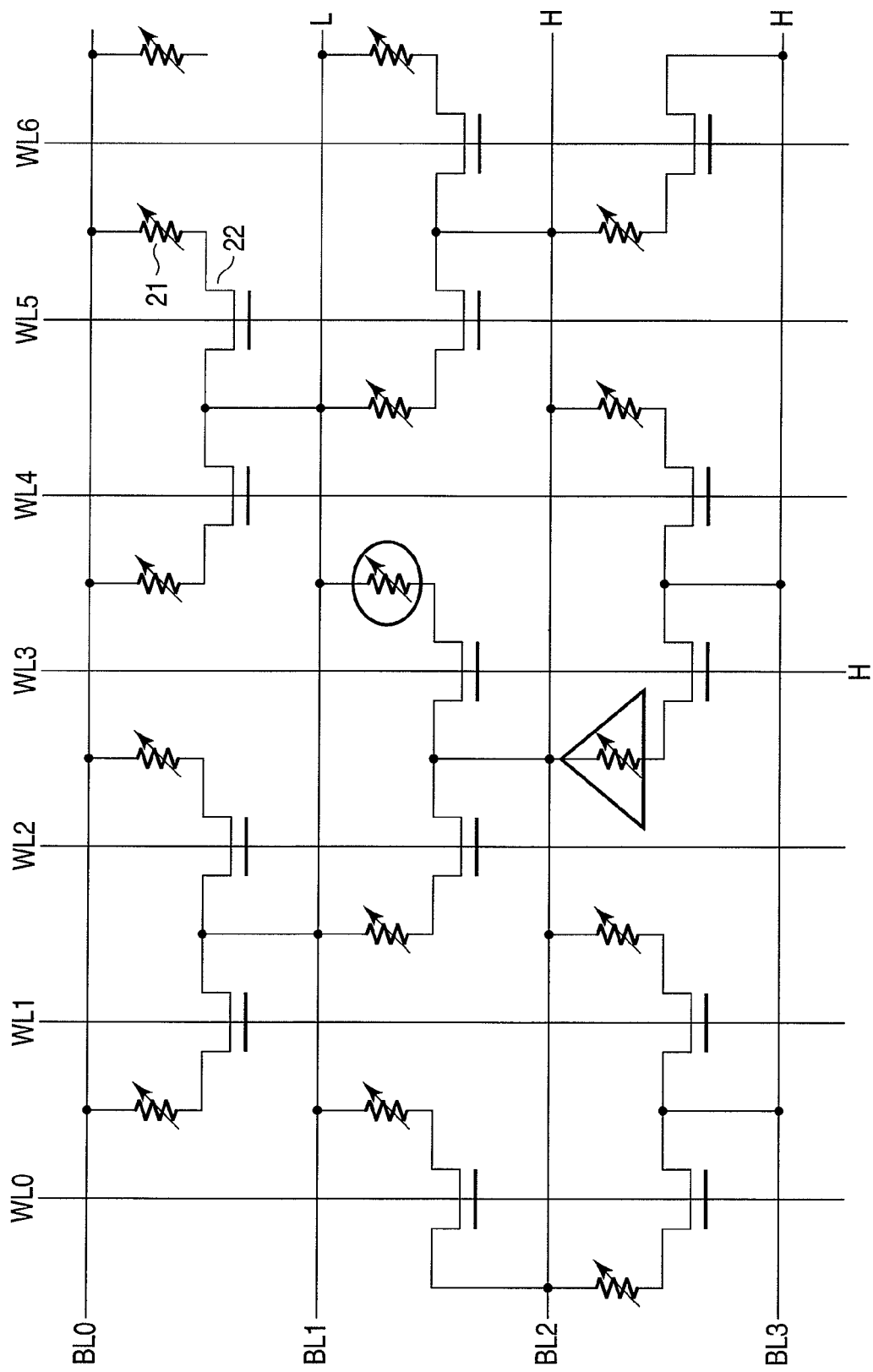
FIG. 13 is a view for explaining the operation of the MRAM 10.

An operation of reading data from the MTJ element 21 indicated by the circle in FIG. 13 will be described. In this case, the row decoder 12 sets word line WL3 high. Subsequently, the sense amplifier 15 sets bit line BL1 at the low voltage, and bit lines BL2 and BL3 at the high voltage Vr. Voltage control like this makes it possible to perform a read operation of the selected memory cell without supplying any unnecessary current to an unselected memory cell indicated by the triangle. An operation of writing data "0" in the MTJ element 21 indicated by the circle is the same as the read operation described above, except that the high voltage rises.

Figure 14:
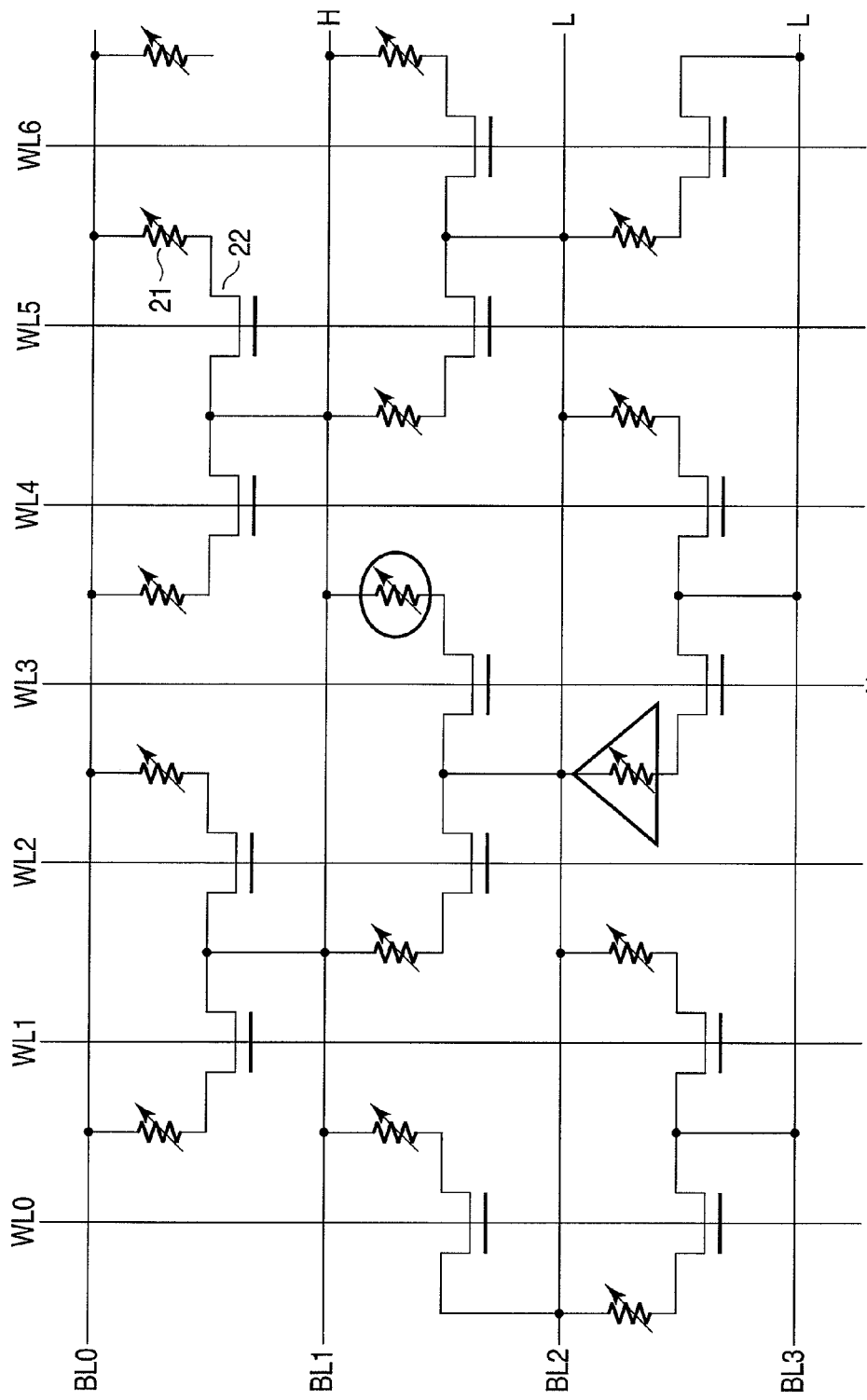
FIG. 14 is a view for explaining the operation of the MRAM 10.

As shown in FIG. 14, when writing data "1" in the MTJ element 21 indicated by the circle, the write driver 16 sets bit line BL1 at the high voltage Vw, and bit lines BL2 and BL3 at the low voltage. Voltage control like this can prevent an unnecessary current from flowing to an unselected memory cell while continuously supplying a write current to the selected memory cell. Accordingly, a write error of the unselected memory cell can be prevented.

(Effects)

In the first embodiment as described in detail above, the memory cell array 11 is constructed by arranging the plurality of memory cells MC each including the MTJ element 21 and selection transistor 22. In the layout of four MTJ elements (first to fourth MTJ elements) arranged in order in the X-direction, a first pair including the first and second MTJ elements arranged to sandwich one word line between them and a second pair including the third and fourth MTJ elements arranged to sandwich one word line between them are arranged to sandwich two word lines between them. A column is constructed by repeating the above layout in the X-direction. Also, a second column adjacent to a first column in the Y-direction has a layout obtained by shifting the first column by one word line in the X-direction.

Accordingly, the first embodiment can implement single-layered bit lines by which all bit lines are formed in interconnection layers on the same level, and implement the memory cell MC having a size of $6F^2$ at the same time. This makes it possible to reduce the chip area and interconnection levels.

Furthermore, when applying a potential difference to a selected memory cell as an access target in a read operation and write operation, voltage control is performed so as not to apply any potential difference to an unselected memory cell that is not an access target. Therefore, a read error of the selected memory cell and a write error of the unselected memory cell can be prevented.

Second Embodiment

In the second embodiment, a plurality of element areas AA are formed into stripes in order to facilitate the step of forming the element areas AA. That is, the second embodiment is a configuration example in which the element areas exist in regions where no element areas exist and word lines WL run in the first embodiment.

Figure 15:
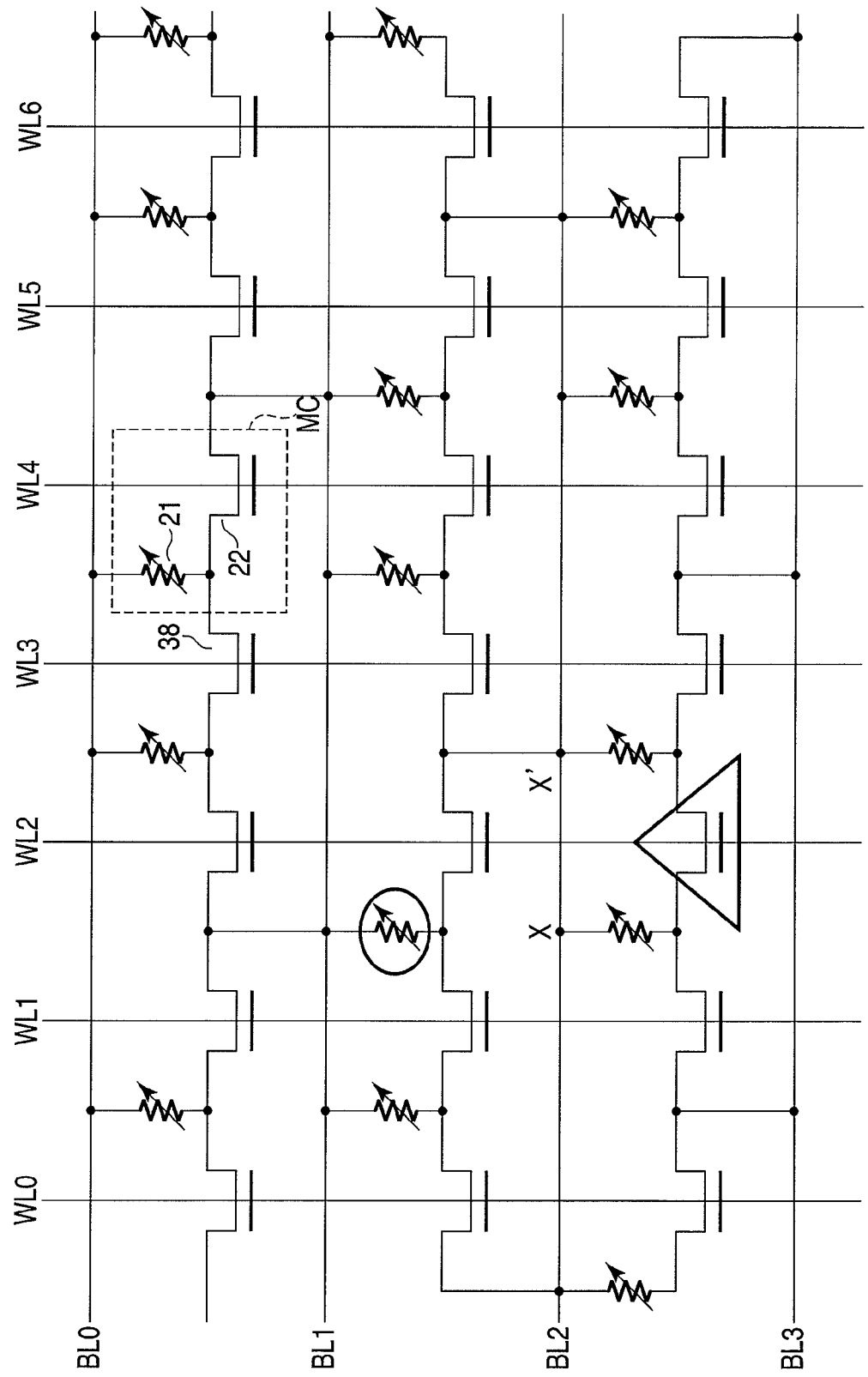
FIG. 15 is a circuit diagram of a memory cell array 11 according to the second embodiment.
Figure 16:
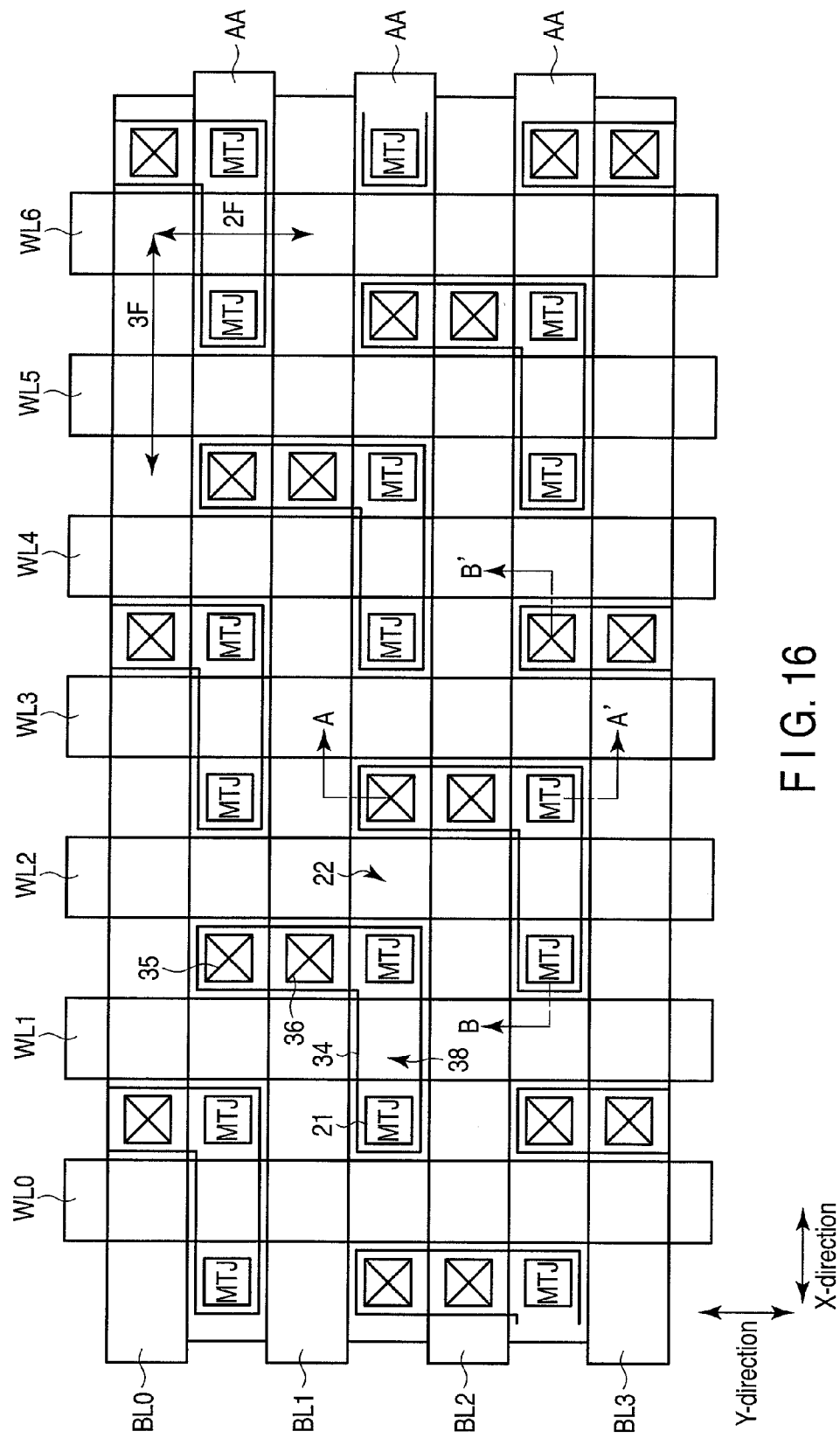
FIG. 16 is a layout view showing the arrangement of the memory cell array 11.
Figure 17:
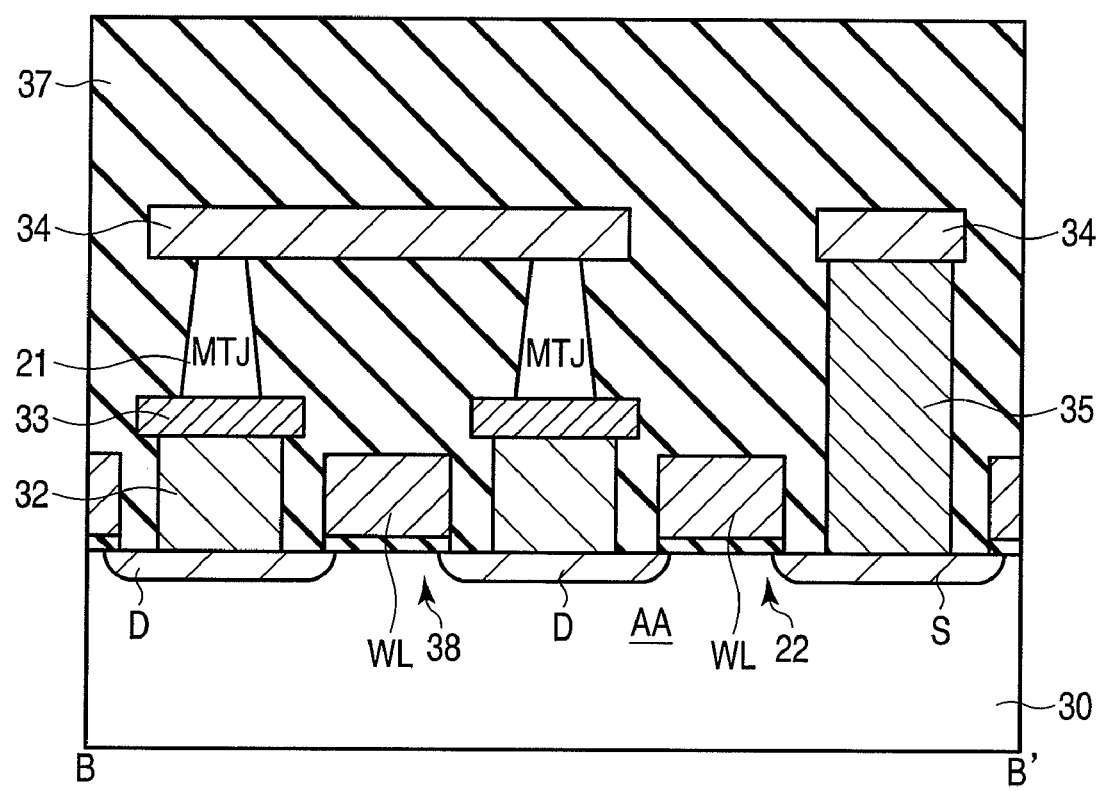
FIG. 17 is a sectional view of the memory cell array 11 taken along line B-B' in FIG. 16.

FIG. 15 is a circuit diagram of a memory cell array 11 according to the second embodiment. FIG. 16 is a layout view showing the arrangement of the memory cell array 11. FIG. 17 is a sectional view of the memory cell array 11 taken along line B-B' in FIG. 16. Note that a sectional view taken along line A-A' in FIG. 16 is the same as FIG. 4.

As shown in FIGS. 16 and 17, the plurality of stripe-like element areas AA are formed in a P-type semiconductor substrate 30 so as to extend in the X-direction. That is, the plurality of element areas AA have line-and-space patterns formed with the minimum feature size F. In a plan view, the element areas AA are arranged between bit lines. Since the element areas AA are stripes, MTJ elements 21 adjacent to each other in the X-direction are connected by a dummy transistor 38. The dummy transistor 38 is an N-channel MOSFET.

In the second embodiment as described above, the dummy transistors 38 are formed in regions that do not exist in the first embodiment. When an MRAM 10 is in operation, however, it is unnecessary to change the voltage control of bit lines BL and word lines WL from that of the first embodiment, and the dummy transistors 38 added to the arrangement of the first embodiment do not cause any operation error.

When writing data "0" in a selected memory cell indicated by the circle in FIG. 15, for example, after a word line WL2 is set high, a bit line BL1 is set at a low voltage, and bit lines BL2 and BL3 are set at a high voltage Vw. In this case, a selection transistor 22 of an unselected memory cell indicated by the triangle is turned on. Since, however, the resistance of bit line BL is sufficiently low, no potential difference is produced between nodes X and X' shown in FIG. 15. Accordingly, it is possible to prevent an unnecessary current from flowing in the direction of X→MTJ element→selection transistor indicated by triangle→MTJ element→X', thereby preventing a write error of the unselected memory cell.

Since the new dummy transistors 38 are added to the first embodiment, a slight extra gate capacitance is added to word line WL. However, the patterns of the element areas AA are changed from the island-like patterns of the first embodiment to the line-and-space (L/S) patterns, and this facilitates lithography. This makes it possible to obtain the great merit that the processability increases. The rest of the effects are the same as those of the first embodiment.

Third Embodiment

In the third embodiment, element areas AA are obliquely formed, and two selection transistors 22 sharing the source region are formed in each element area AA. Also, MTJ elements 21 are formed above drain regions formed at the two ends of the element area AA. A memory cell MC having a size of $6F^2$ is implemented by laying out the MTJ elements 21 in accordance with a predetermined rule.

Figure 19:
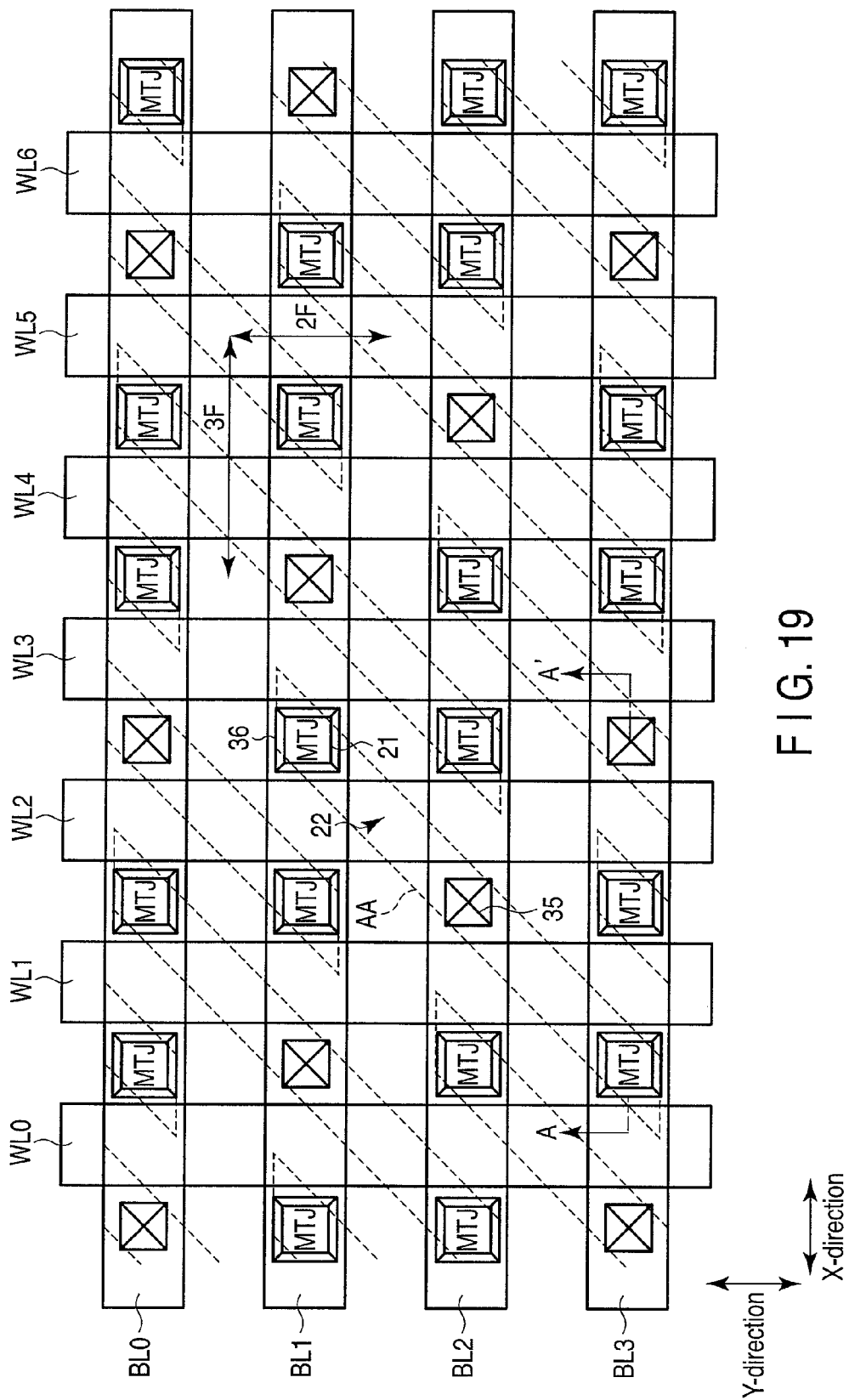
FIG. 19 is a layout view showing the arrangement of the memory cell array 11.

FIG. 18 is a circuit diagram of a memory cell array 11 according to the third embodiment. FIG. 19 is a layout view showing the arrangement of the memory cell array 11. FIG. 20 is a sectional view of the memory cell array 11 taken along line A-A' in FIG. 19.

A plurality of obliquely extending element areas AA are formed in a P-type semiconductor substrate 30. Each element area AA intersects two word lines WL. Two selection transistors 22 sharing a source region S are formed in the element area AA. A via plug 35 is formed on the source region S in the center of the element area AA. A bit line BL running in the X-direction is formed on the via plug 35.

Drain regions D are formed at the two ends of the element area AA. A via plug 32, a lower electrode 33, the MTJ element 21, a via plug 36, and bit line BL are stacked on the drain region D. In this embodiment, the MTJ element 21 is formed below bit line BL.

The feature of the layout of the MTJ elements 21 will be explained below. As shown in FIG. 19, in the layout of four MTJ elements (first to fourth MTJ elements) arranged in order in the X-direction, the first and second MTJ elements are arranged to sandwich one word line between them, and the third and fourth MTJ elements are arranged to sandwich one word line between them. Also, a first pair including the first and second MTJ elements and a second pair including the third and fourth MTJ elements are arranged to sandwich two word lines between them. A column is constructed by repeating the above layout in the X-direction.

A second column adjacent to a first column in the Y-direction has a layout obtained by shifting the first column by one word line in the X-direction (to the right in FIG. 19). A third column adjacent to the second column in the Y-direction and subsequent columns are constructed in accordance with this rule.

Furthermore, all bit lines BL are formed in interconnection layers on the same level. The memory cell MC having a size of $6F^2$ can be implemented in this embodiment as well.

(Operation)

The operation of the MRAM 10 constructed as described above will be explained below. In the third embodiment, as in the first embodiment described previously, when a word line WL connected to a selected memory cell as an access target is activated, a selection transistor included in an unselected memory cell that is connected to the activated word line WL and is not an access target is turned on.

Accordingly, as in the first embodiment, a sense amplifier 15 or write driver 16 produces a potential difference between two bit lines connected to the selected memory cell, and equalizes the potentials of two bit lines connected to the unselected memory cell that is connected to the activated word line and is not an access target. In a read operation, therefore, it is possible to prevent a current of the unselected memory cell from being added to a read current of the selected memory cell, thereby preventing a read error of the selected memory cell. Also, in a write operation, it is possible to prevent an unnecessary current from flowing to the unselected memory cell, thereby preventing a write error of the unselected memory cell.

Fourth Embodiment

The fourth embodiment is another configuration example of an MRAM 10 that implements single-layered bit lines and a memory cell MC having a size of $6F^2$.

Figure 21:
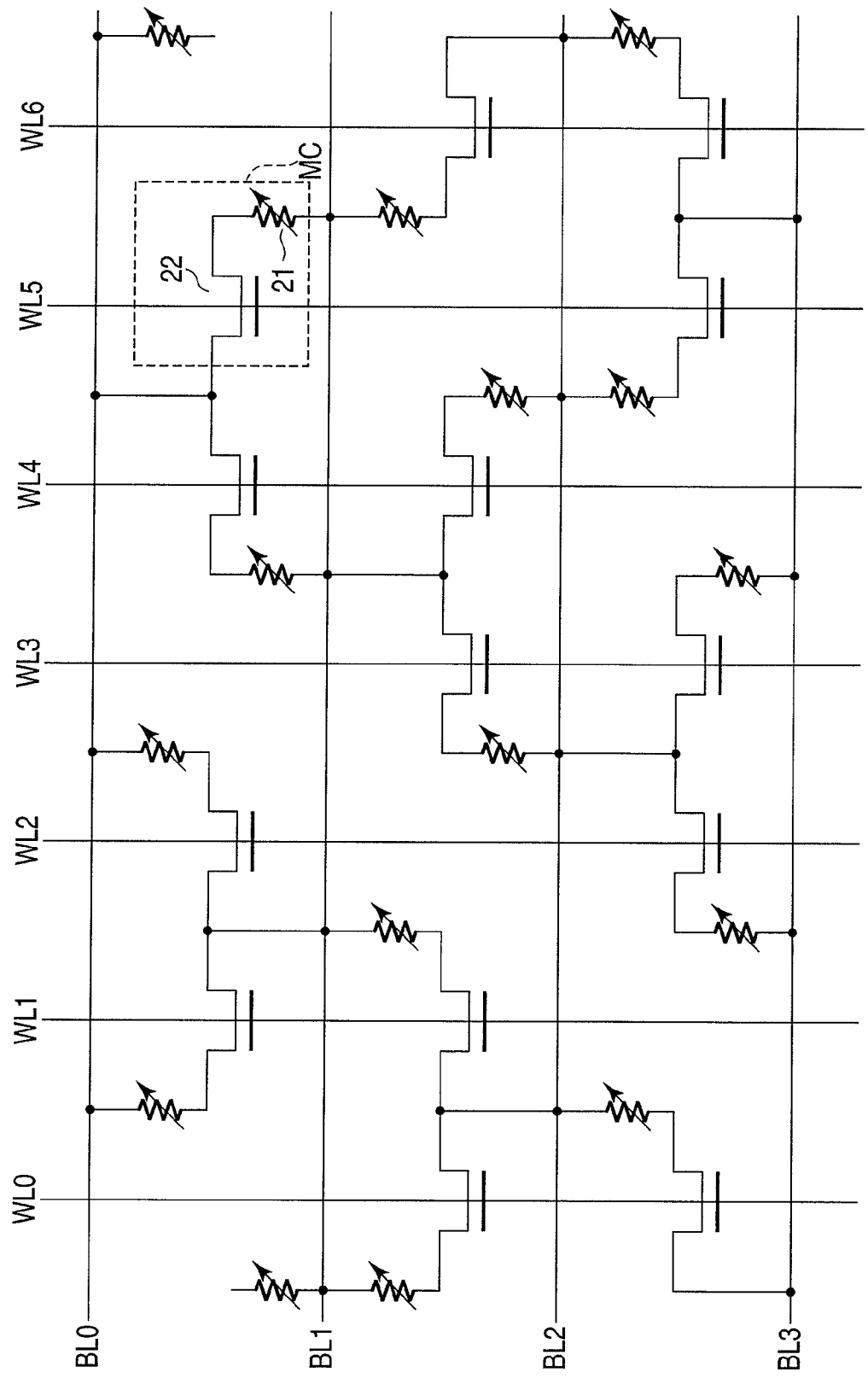
FIG. 21 is a circuit diagram of a memory cell array 11 according to the fourth embodiment.
Figure 22:
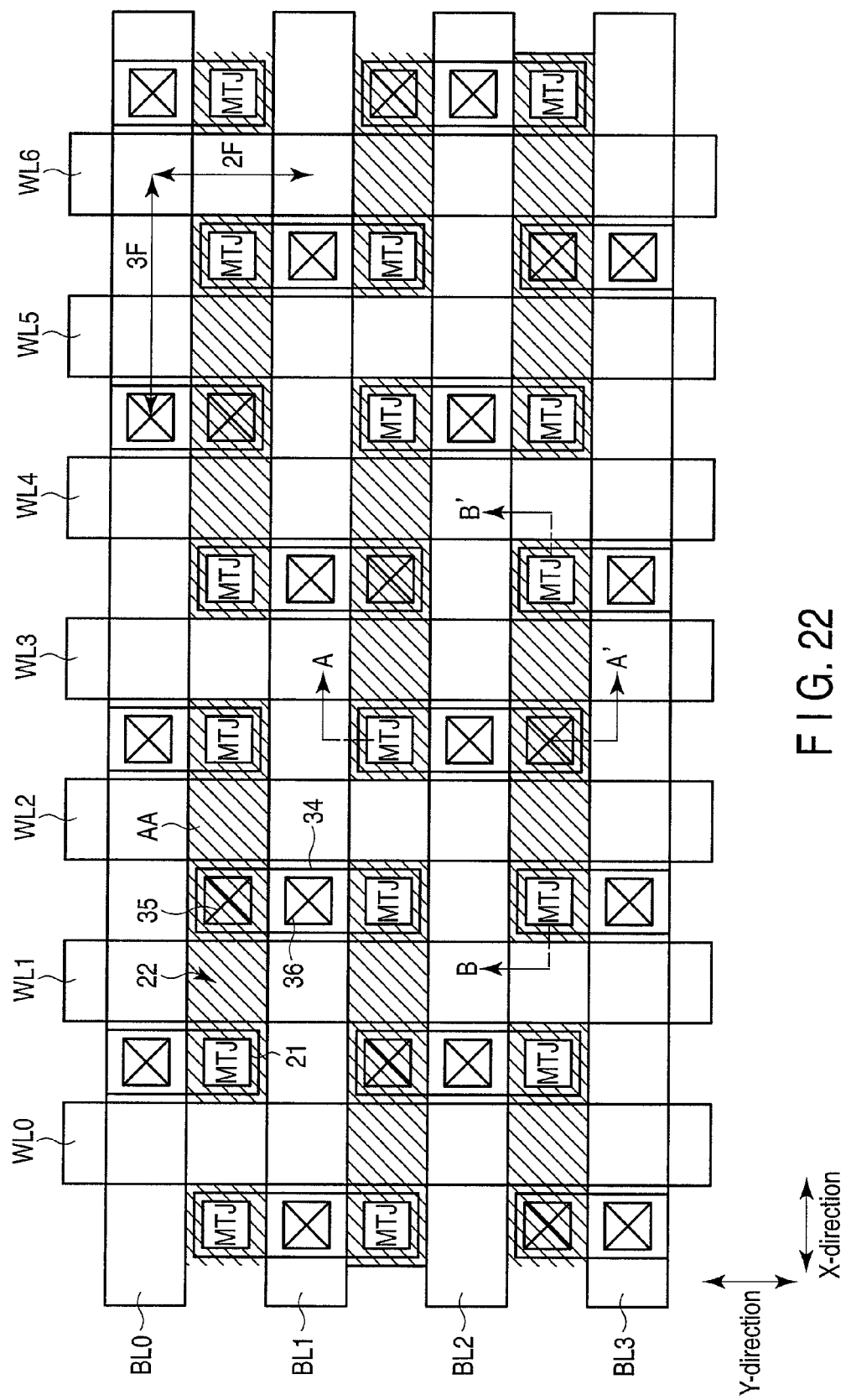
FIG. 22 is a layout view showing the arrangement of the memory cell array 11.
Figure 23:
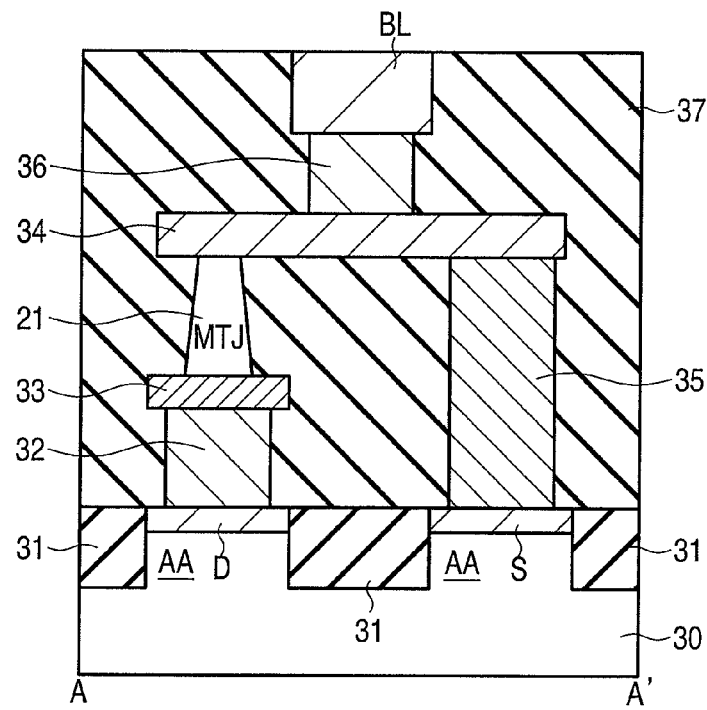
FIG. 23 is a sectional view of the memory cell array 11 taken along line A-A' in FIG. 22.
Figure 24:
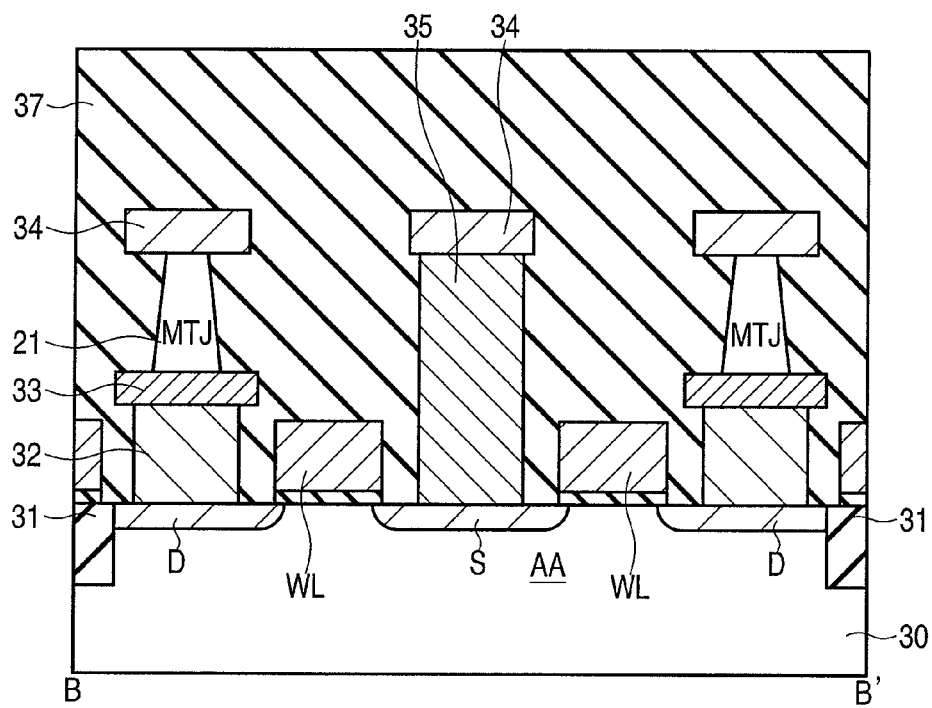
FIG. 24 is a sectional view of the memory cell array 11 taken along line B-B' in FIG. 22.

FIG. 21 is a circuit diagram of a memory cell array 11 according to the fourth embodiment. FIG. 22 is a layout view showing the arrangement of the memory cell array 11. FIG. 23 is a sectional view of the memory cell array 11 taken along line A-A' in FIG. 22. FIG. 24 is a sectional view of the memory cell array 11 taken along line B-B' in FIG. 22.

A plurality of element areas AA each extending in the X-direction are formed in the surface region of a P-type semiconductor substrate 30. Referring to FIG. 22, hatched portions are the element areas AA. In a plan view, the element areas AA are arranged between bit lines. Each element area AA intersects two word lines WL. Two selection transistors 22 sharing a source region S are formed in the element area AA.

Drain regions D are formed at the two ends of the element area AA. A via plug 32, lower electrode 33, MTJ element 21, and upper electrode 34 are stacked on the drain region D. A via plug 35 and the upper electrode 34 are stacked on the source region S in the center of the element area AA. The upper electrode 34 connects the MTJ element 21 and a source region in a second element area adjacent in the Y-direction to a first element area connected to the lower electrode 33 of the MTJ element 21. The planar shape of the upper electrode 34 is a rectangle extending in the Y-direction.

The second element area is formed obliquely to the first element area. In other words, the first and second element areas are formed to sandwich one bit line between them, and the second element area is shifted from the first element area by one word line in the X-direction (to be left in FIG. 22).

A via plug 36 is formed in the center of the upper electrode 34. A bit line BL running in the X-direction is formed on the via plug 36.

The feature of the layout of the MTJ elements 21 will be explained below. As shown in FIG. 22, in the layout of four MTJ elements (first to fourth MTJ elements) arranged in order in the X-direction, the first and second MTJ elements are arranged to sandwich one word line between them, and the third and fourth MTJ elements are arranged to sandwich one word line between them. Also, a first pair including the first and second MTJ elements and a second pair including the third and fourth MTJ elements are arranged to sandwich two word lines between them. A column is constructed by repeating the above layout in the X-direction.

A second column adjacent to a first column in the Y-direction has a layout obtained by shifting the first column by one word line in the X-direction (to the left in FIG. 22). A third column adjacent to the second column in the Y-direction and subsequent columns are constructed in accordance with this rule.

Furthermore, all bit lines BL are formed in interconnection layers on the same level. The memory cell MC having a size of $6F^2$ can be implemented in this embodiment as well.

(Operation)

The operation of the MRAM 10 constructed as described above will be explained below. In the fourth embodiment, as in the first embodiment described previously, when a word line WL connected to a selected memory cell as an access target is activated, a selection transistor included in an unselected memory cell that is connected to the activated word line WL and is not an access target is turned on.

Accordingly, as in the first embodiment, a sense amplifier 15 or write driver 16 produces a potential difference between two bit lines connected to the selected memory cell, and equalizes the potentials of two bit lines connected to the unselected memory cell that is connected to the activated word line and is not an access target. In a read operation, therefore, it is possible to prevent a current of the unselected memory cell from being added to a read current of the selected memory cell, thereby preventing a read error of the selected memory cell. Also, in a write operation, it is possible to prevent an unnecessary current from flowing to the unselected memory cell, thereby preventing a write error of the unselected memory cell.

Fifth Embodiment

The fifth embodiment is still another configuration example of an MRAM 10 that implements single-layered bit lines and a memory cell MC having a size of 6F².

Figure 25:
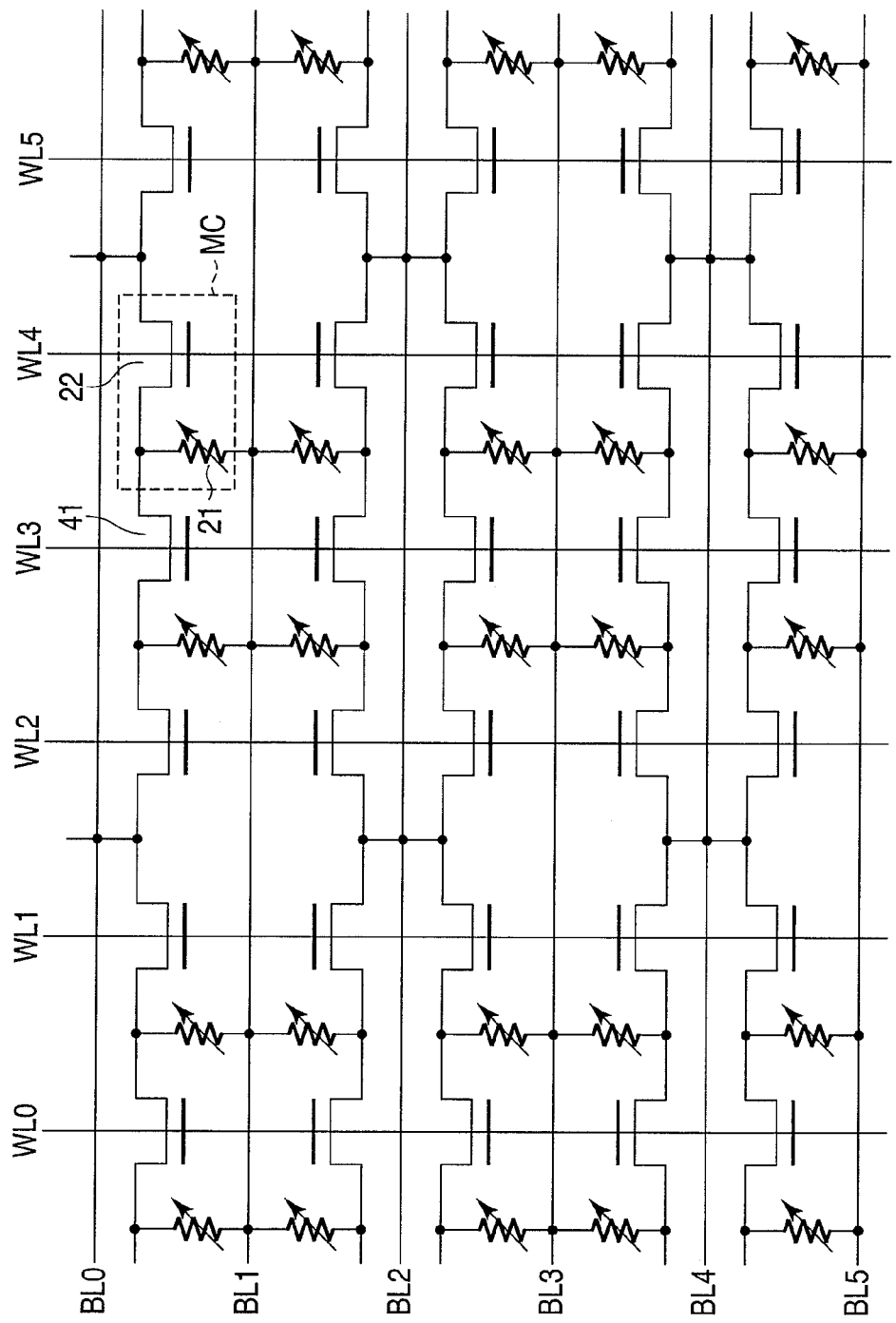
FIG. 25 is a circuit diagram of a memory cell array 11 according to the fifth embodiment.
Figure 26:
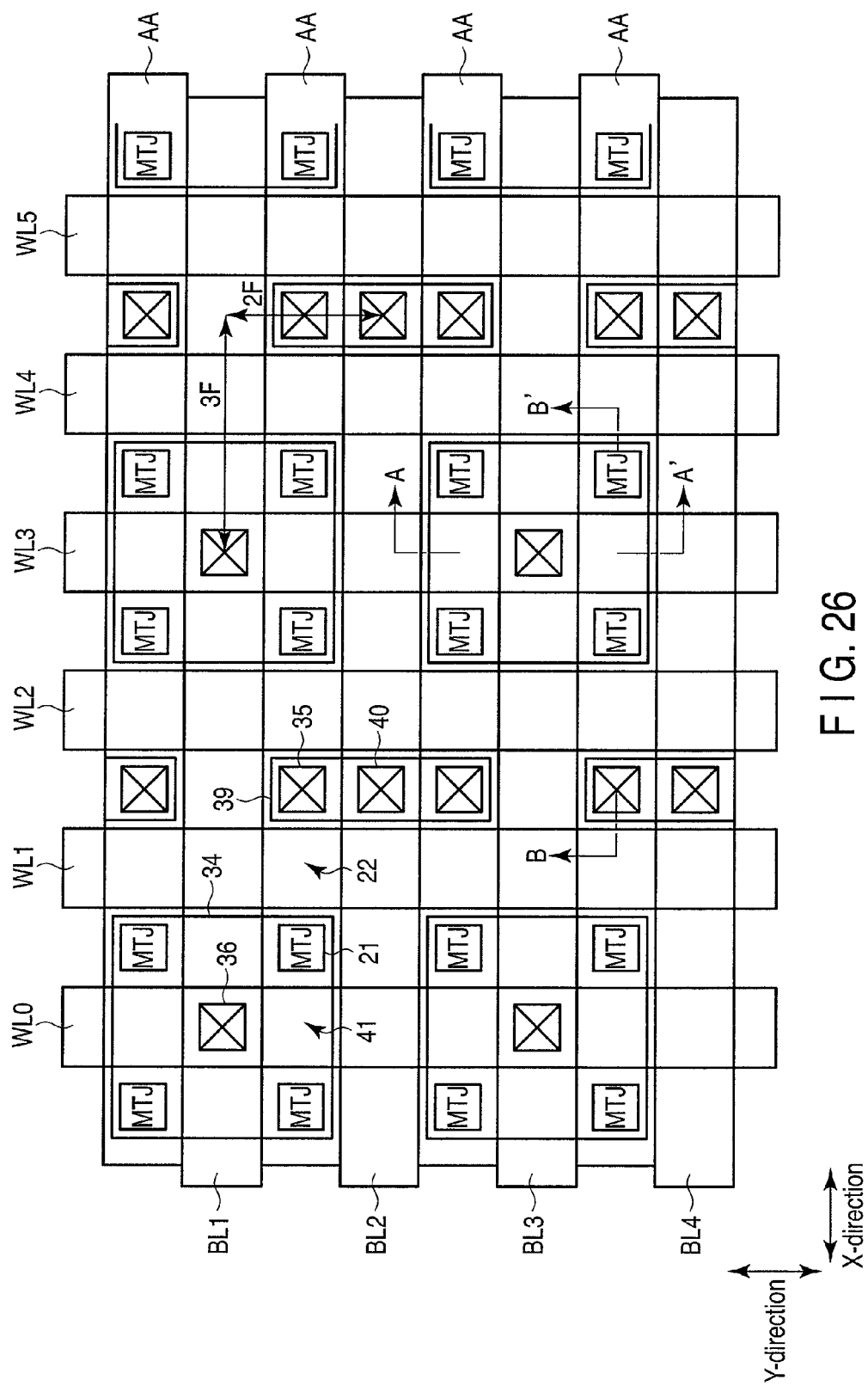
FIG. 26 is a layout view showing the arrangement of the memory cell array 11.

FIG. 25 is a circuit diagram of a memory cell array 11 according to the fifth embodiment. FIG. 26 is a layout view showing the arrangement of the memory cell array 11. FIG. 27 is a sectional view of the memory cell array 11 taken along line A-A' in FIG. 26. FIG. 28 is a sectional view of the memory cell array 11 taken along line B-B' in FIG. 26.

A plurality of stripe-like element areas AA are formed in a P-type semiconductor substrate 30 so as to extend in the X-direction. That is, the plurality of element areas AA have line-and-space patterns formed with the minimum feature size F. In a plan view, the element areas AA are arranged between bit lines.

A via plug 32, lower electrode 33, MTJ element 21, and upper electrode 34 are sequentially stacked on a drain region D formed in the element area AA. The upper electrode 34 connects four MTJ elements 21 adjacent to each other in the X- and Y-directions. As shown in the circuit diagram of FIG. 25, the MTJ elements 21 adjacent to each other to sandwich one word line WL between them are connected by a dummy transistor 41 in the layout as shown in FIG. 26. A via plug 36 is formed in the center of the upper electrode 34. A bit line BL running in the X-direction is formed on the via plug 36.

A via plug 35 and intermediate interconnection 39 are sequentially stacked on a source region S formed in the element area AA. The intermediate interconnection 39 connects the via plugs 35 adjacent to each other in the Y-direction so as to sandwich one bit line BL between them. A via plug 40 is formed in the center of the intermediate interconnection 39. Bit line BL is formed on the via plug 40.

The feature of the layout of the MTJ elements 21 will be explained below. As shown in FIG. 26, in the layout of four MTJ elements (first to fourth MTJ elements) arranged in order in the X-direction, the first and second MTJ elements are arranged to sandwich one word line between them, and the third and fourth MTJ elements are arranged to sandwich one word line between them. Also, a first pair including the first and second MTJ elements and a second pair including the third and fourth MTJ elements are arranged to sandwich two word lines between them. A column is constructed by repeating the above layout in the X-direction. In addition, two columns adjacent to each other in the Y-direction are axially symmetrical with respect to a line passing through the center of the bit line.

(Operation)

Figure 29:
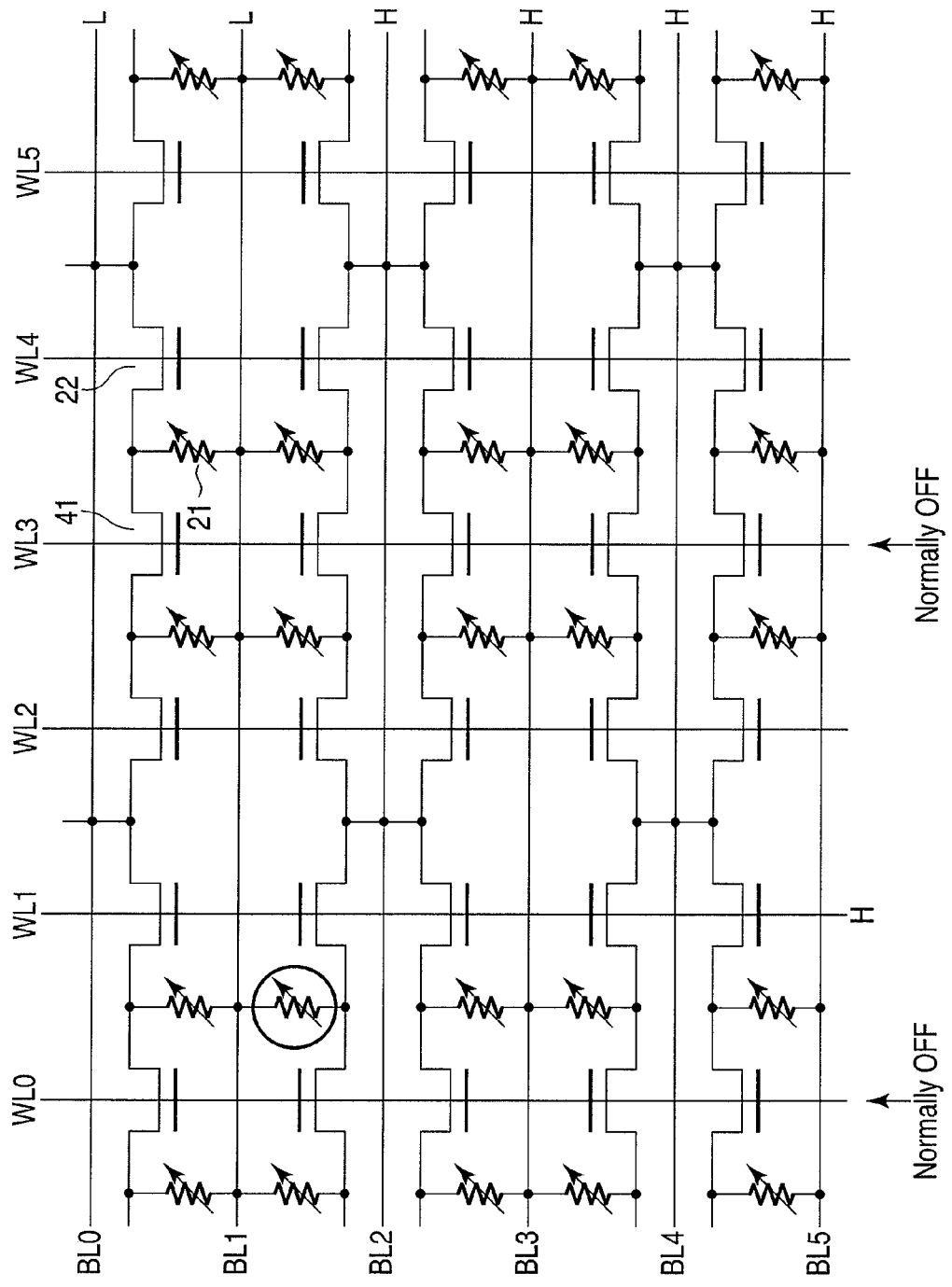
FIG. 29 is a view for explaining the operation of an MRAM 10.

The operation of the MRAM 10 constructed as described above will be explained below. As shown in FIG. 29, in a write operation and read operation, word lines (word lines WL0 and WL3 in FIG. 29) connected to the gates of the dummy transistors 41 are normally set low, so the dummy transistors 41 are normally off.

In a write operation and read operation of this embodiment, all bit lines BL are activated and set at a high voltage or low voltage in order to prevent an unnecessary sneak current from flowing to an unselected memory cell.

When accessing the MTJ element 21 indicated by the circle in FIG. 29, for example, a sense amplifier 15 or write driver 16 sets bit lines BL0 and BL1 low, and bit lines BL2 to BL5 at the high voltage.

The fifth embodiment can also implement single-layered bit lines, and the memory cell MC having a size of 6F². In addition, the fifth embodiment has the effect of facilitating lithography and processing because the element areas AA, word lines WL, and bit lines BL all have simple line-and-space patterns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising:
   bit lines in a first direction;
   word lines in a second direction intersecting with the first direction; and
   a memory cell array comprising memory cells each comprising a selection transistor and a variable resistance element configured to store data "0" and data "1" by a change in resistance value, the variable resistance element comprising a first terminal connected to a first bit line and a second terminal connected to a drain of the selection transistor, the selection transistor comprising a source connected to a second bit line and a gate connected to a word line,
   wherein a first word line is between the first variable resistance element and the second variable resistance element, a second word line is between the third variable resistance element and the fourth variable resistance element, two word lines are between a first pair comprising the first and second variable resistance elements and a second pair comprising the third and fourth variable resistance elements, in a layout of first to fourth variable resistance elements in order in the first direction, and
   a column is constructed by repeating the layout in the first direction.

2. The memory of claim 1, wherein a second column adjacent to a first column in the second direction comprises a layout by shifting the first column by one word line.

3. The memory of claim 1, wherein the bit lines are in the same level layer.

4. The memory of claim 1, further comprising:
   a row decoder configured to activate a word line connected to a selected memory cell as an access target; and
   a voltage controller configured to generate a potential difference between two bit lines connected to the selected memory cell, and to equalize potentials of two bit lines connected to an unselected memory cell which is connected to the activated word line and is not an access target.

5. The memory of claim 1, further comprising a metal electrode configured to connect first terminals of the paired variable resistance elements.

6. The memory of claim 5, further comprising a via plug on a source of a selection transistor adjacent to the paired variable resistance elements in the second direction, wherein the metal electrode connects the first terminals of the paired variable resistance elements and the via plug.

7. The memory of claim 1, wherein a first selection transistor connected to the second variable resistance element and a second selection transistor connected to the third variable resistance element are configured to share a source.

8. The memory of claim 1, wherein the variable resistance elements are between the bit lines.

9. The memory of claim 1, wherein the variable resistance elements are below the bit line.

10. The memory of claim 1, further comprising:
a semiconductor substrate; and
element areas in the semiconductor substrate,
wherein the source and drain of the selection transistor are in the element areas, and
the element areas extend in the first direction and comprise island-like patterns.

11. The memory of claim 10, wherein the element areas are between the bit lines.

12. The memory of claim 1, further comprising:
a semiconductor substrate; and
element areas in the semiconductor substrate,
wherein the source and drain of the selection transistor are in the element areas, and
a first selection transistor connected to the second variable resistance element and a second selection transistor connected to the third variable resistance element are in one element area, and configured to share a source.

13. The memory of claim 12, wherein:
the second variable resistance element is on a via plug on a drain of the first selection transistor; and
the third variable resistance element is on a via plug on a drain of the second selection transistor.

14. The memory of claim 1, further comprising:
a semiconductor substrate; and
element areas in the semiconductor substrate,
wherein the source and drain of the selection transistor are in the element areas, and
the element areas extend in the first direction and comprise line-and-space patterns.

15. The memory of claim 14, wherein the element areas are between the bit lines.

16. The memory of claim 1, further comprising:
a semiconductor substrate; and
element areas in the semiconductor substrate, and
wherein the source and drain of the selection transistor are in the element areas, and
the element areas extend in a direction oblique to the first direction.

17. The memory of claim 16, wherein a first selection transistor and a second selection transistor adjacent to each other in the oblique direction are in one element area, and configured to share a source.

18. The memory of claim 1, wherein the variable resistance element comprises a reference layer comprising a fixed magnetization direction, a recording layer comprising a changeable magnetization direction, and a nonmagnetic layer between the reference layer and the recording layer.

* * * * *